United States Patent [19]
Nishimura

[11] Patent Number: 6,040,810
[45] Date of Patent: Mar. 21, 2000

[54] DISPLAY DEVICE HAVING DISPLAY AND IMAGING PIXELS SANDWICHED BETWEEN SAME SUBSTRATES

[75] Inventor: Toshio Nishimura, Kyoto, Japan

[73] Assignee: Sharp Kabushiki Kaisha, Osaka, Japan

[21] Appl. No.: 08/779,529

[22] Filed: Jan. 7, 1997

[30] Foreign Application Priority Data

Jan. 8, 1996 [JP] Japan ................................ 8-000775

[51] Int. Cl.⁷ .................................................... G09G 3/36
[52] U.S. Cl. ............................................................ 345/87
[58] Field of Search ............................... 345/87, 55, 197, 345/205, 206, 84; 348/62, 20, 18, 14, 15, 19; 349/41, 50, 24, 28, 13, 42, 59, 62, 29; 455/556, 557; 385/115, 116; 327/403, 404

[56] References Cited

U.S. PATENT DOCUMENTS

| | | | |
|---|---|---|---|
| 3,792,465 | 2/1974 | Collins et al. | 345/197 |
| 4,227,201 | 10/1980 | Grinberg et al. | 349/41 |
| 4,400,725 | 8/1983 | Tanigaki | 348/20 |
| 4,655,552 | 4/1987 | Togashi et al. | 348/24 |
| 5,079,636 | 1/1992 | Brody | 345/55 |
| 5,127,078 | 6/1992 | Terry et al. | 385/116 |
| 5,227,886 | 7/1993 | Efron et al. | 348/62 |
| 5,237,314 | 8/1993 | Knapp | 345/84 |
| 5,396,269 | 3/1995 | Gotoh et al. | 348/14 |
| 5,420,534 | 5/1995 | Elabd | 327/404 |
| 5,638,103 | 6/1997 | Obata et al. | 347/164 |
| 5,673,127 | 9/1997 | Takahara et al. | 349/42 |
| 5,825,408 | 10/1998 | Yuyama et al. | 348/14 |
| 5,867,209 | 2/1999 | Irie et al. | 348/19 |

FOREIGN PATENT DOCUMENTS

| | | |
|---|---|---|
| 1-106467 | 4/1989 | Japan . |
| 5-14880 | 1/1993 | Japan . |
| 5-276313 | 10/1993 | Japan . |
| 6-245209 | 9/1994 | Japan . |

*Primary Examiner*—Chanh Nguyen
*Attorney, Agent, or Firm*—Nixon & Vanderhye

[57] ABSTRACT

In a picture telephone, an apparatus is provided which images the face of an operator in a natural manner for a conversation, with an eye height at which the operator looks at an image expressing a partner of the conversation. A number of photodiodes are disposed each adjacent to each pixel electrode, on surfaces facing each other of a pair of substrates between which a liquid crystal of a transmission type active matrix liquid crystal display apparatus is interposed. Outputs from the respective photodiodes are read out by a so-called inter-line transmission method which utilizes a scanning function of a CCD (charge coupled device).

19 Claims, 24 Drawing Sheets

DISPLAY DEVICE HAVING DISPLAY AND IMAGING PIXELS SANDWICHED BETWEEN SAME SUBSTRATES

BACKGROUND OF THE INVENTION

1. Field of the Invention

The present invention relates to an apparatus which realizes a displaying function and an imaging function.

2. Description of the Related Art

FIG. 27 shows a typical prior art. A picture telephone 1 includes a personal computer 2 and a television camera 3. The personal computer 2 includes a personal computer main unit 4 including a central processing unit, a key board 5 which has ten numerical keys for manipulation, and a display apparatus 6 such as a cathode ray tube. The display apparatus 6 receives an image, such as the face of a conversation partner who is on the picture telephone, through a telephone line, and displays the image. The face of an operator who uses the picture telephone is imaged by the television camera 3 which is disposed above the display apparatus 6, and a signal expressing the face is sent through the telephone line. Further, in relation to the personal computer 2, a speaker 7 for a television audio output and a microphone 8 for sending the operator's voice are disposed.

According to the prior art as shown in FIG. 27, since the operator looks at a screen of the display apparatus 6, the television camera 3 always images the operator with his head down. The television camera 3 cannot image an expression on the full face of the operator as he is seen head-on, which in turn degrades the function of the picture television.

Another prior art is disclosed in Japanese Unexamined Patent Publication JP-A 5-14880 (1993). According to this prior art, a solid-state imaging device formed by a two-dimensional image sensor using a charge coupled device (abbreviated as "CCD") is disposed to a side portion of an image display apparatus. The solid-state imaging device images the face of an operator who looks at a display screen slightly from a side angle, but cannot image the full face of the operator.

Still another prior art is disclosed in Japanese Unexamined Patent Publication JP-A 6-245209 (1994). In a camera-integrated display apparatus disclosed herein, a hole is formed in a polarization plate which is disposed in the back of a liquid crystal display portion so that light entering through the hole is allowed into a television camera for imaging.

This prior art is advantageous in that the television camera can image the full face of an operator who looks at the liquid crystal display portion. However, since the polarization plate includes the hole for guiding light into the television camera, an image displayed on the screen is defective.

Still other prior arts are disclosed in Japanese Unexamined Patent Publication JP-A 1-106467 (1989) and 5-276313 (1993). These prior arts are connected to a personal computer, a word processor or the like to enable a function of reading an original by contacting with the original and displaying an image.

Hence, when these prior arts are applied to a picture telephone, etc., it is not possible to image an object, such as an image of an operator of the picture telephone, which is far away from an imaging position, and therefore application is limited.

In a prior art imaging apparatus, a field stop mechanism which has a mechanical structure with a variable aperture diameter realizes adjustment of the amount of light incident upon an imaging element, namely, adjustment of exposure. It is clear that such a structure inevitably requires the imaging apparatus to be large. This is a main impediment to saving of product cost.

In a prior art image sensor, such as a CCD, which has a so-called electronic iris function, an electronic shutter controls the light-receptivity. This is different from a full-fledged exposure adjusting function.

SUMMARY OF THE INVENTION

Hence, an object of the invention is to provide an apparatus for displaying and imaging which integrates a structure for realizing a displaying function with a structure for realizing an imaging function so as to perform imaging without deteriorating a display quality, and which has a small and simple structure.

Another object of the invention is to provide an apparatus for displaying and imaging which easily adjusts a light-receiving amount during imaging.

The invention provides an apparatus for displaying and imaging in which electrodes are formed on surfaces facing each other of a pair of substrates, to form pixels, and a dielectric element is interposed between the pair of substrates to attain a display function, the apparatus comprising;
  a number of light-receiving elements disposed on said surfaces; and
  outputting means for individually deriving outputs from the respective light-receiving elements to attain an imaging function.

The invention is characterized in that the outputting means is composed of a semiconductor, and comprises:
  column shift registers for reading out the outputs from light-receiving elements of each column in a parallel manner and shifting the outputs as a serial bit in a column direction; and
  a row shift register for sequentially deriving an output of each column shift register as a serial bit to a common output terminal for each column shift register.

The invention is characterized in that the column registers and the row shift register are structured so that scanning using a charge coupled device is carried out.

The invention is characterized in that on one of the surfaces facing each other of the pair of substrates are formed:
  pixel electrodes arranged in a matrix form;
  a plurality of gate lines extending in the column direction, and
  a plurality of source lines extending in the row direction;
  thin film transistors are provided so as to correspond to intersections of the gate lines and the source lines,
  each of the thin film transistor including a source electrode which is connected to one of the source lines, a gate electrode which is connected to one of the gate lines, and a drain electrode which is connected to one of the pixel electrodes,
  the source electrode and the drain electrode of each thin film transistor being brought into conduction on application of a voltage of one level to the gate lines, and being brought out of conduction on application of a voltage of another level to the gate lines;
  a common electrode confronting the pixel electrodes is formed on the other of the surfaces facing each other of the pair of substrates; and means for applying a displaying voltage equal to or larger than a threshold value which activates the dielectric element and for applying a control voltage which brings the thin film transistors into conduction or out of conduction, to the gate lines, is provided between the source lines and the common electrode.

Further, the invention is characterized in that the thin film transistors and the light-receiving elements are arranged between the source lines which are adjacent to each other in the column direction of the pixel electrodes so as to be adjacent to each other in the row direction of the pixel electrodes.

Furthermore, the invention is characterized in that discrete light-transmitting electrodes for adjusting a light-receiving amount are formed on light-receiving surfaces of the respective light-receiving elements, and the light-receiving amount of the light-receiving surface via the dielectric element is adjusted by changing a light transmittance depending on a voltage between the discrete light-receiving amount adjusting electrodes and the electrodes formed on the substrate confronting the substrate on which the light-receiving elements are formed.

Furthermore, the invention is characterized in that lines for adjusting a light-receiving amount and light-receiving elements are formed on the one of the surfaces facing each other of the pair of substrates along and adjacent to the source lines, and the discrete light-receiving amount adjusting electrodes are connected to the light-receiving amount adjusting lines.

Furthermore the invention is characterized in that a distance of the discrete light-receiving amount adjusting electrodes from the common electrode is selected to be smaller than a distance of the pixel electrodes from the common electrode, and the discrete light-receiving amount adjusting electrodes are connected to the source lines; and a voltage is applied to the source lines during a displaying period and a period of adjusting the light-receiving amount which are set alternately, and the voltage applied during the period of adjusting the light-receiving amount is selected to be a value lower than the displaying voltage applied during the displaying period, which value does not activate the dielectric element existing between the pixel electrodes and the common electrode.

Furthermore the invention is characterized in that:

on light-receiving surfaces of the light-receiving elements are formed discrete light-transmitting electrodes for adjusting a light-receiving amount, the discrete electrodes are connected to the source lines, a voltage is applied to the source lines during a displaying period and a period of adjusting the light-receiving amount which are set alternately, and a voltage which keeps the thin film transistors out of conduction is applied to the gate lines during the period of adjusting the light-receiving amount.

Furthermore, the invention is characterized in that the pair of substrates transmits light and a light shielding layer is formed in the rear of the light-receiving elements.

Furthermore the invention provides a television communication apparatus comprising:

(a) a displaying/imaging apparatus disposed to face an operator, in which electrodes are formed on each of surfaces facing each other of a pair of substrates, to form pixels; a display function is realized by interposing a dielectric element between the substrates; a number of light-receiving elements are arranged on said surfaces; and outputting means for individually deriving outputs of the light-receiving elements is provided;

(b) image driving means for receiving an image signal through a communication line and providing the pixel electrodes with the image signal to perform a display operation;

(c) a speaker;

(d) an audio driving circuit for receiving an audio signal through the communication line and driving the speaker;

(e) a microphone; and (f) transmitting means for transmitting outputs from the outputting means and the microphone to the communication line.

The apparatus for displaying and imaging according to the invention is preferably embodied for application as television communication apparatuses, such as a picture telephone machine, a television conference system and a door phone which allows one who is in front of an entrance of a building to have a conversation with a person who is inside the building while looking at the face of that person.

According to the invention, to realize a displaying function, the pixels are formed by forming electrodes on the surfaces facing each other of the pair of substrates and the dielectric element, e.g., preferably of a liquid crystal material, an electroluminescence material or a plasma display material, is disposed, a number of the light-receiving elements, e.g., photodiodes, are arranged with regularity on the surfaces, in the form of a matrix or arranged at random in a dispersed arrangement, and the outputting means individually leads outputs from the light-receiving elements. Hence, when applied to a television communication apparatus, the invention allows, in a condition where an image of the face of a partner of conversation displayed, one to be imaged in a natural manner at the same eye height with the partner while looking at the image of the face of the partner.

According to the invention, the outputting means, using column shift registers and a row register each formed by a semiconductor, by means of a scanning function of a CCD (charge coupled device), for instance, transfers and outputs an output from each light-receiving element. This reduces the size of the structure without deteriorating the quality of a display which is obtained by the light-receiving elements.

The structure according to the invention uses a dielectric element, such as liquid crystal, for achieving a displaying function, so that an active matrix display for performing dynamic displaying is realized. To apply a voltage for driving of displaying to pixel electrodes, thin film transistors (abbreviated as "TFT") which are formed by metal oxide semiconductor field effective transistors (abbreviated as "MOS FET"), for example, may be used, or alternatively, switching elements such as MIM (Metal-Insulator-Metal) elements which are brought into conduction in response to a voltage which exceeds a predetermined threshold value or other types of switching elements may be used. The switching elements such as thin film transistors and the light-receiving elements may be formed adjacent to the pixel electrodes.

Further, according to the invention, since the light-transmitting discrete electrodes for adjusting the light-receiving amount are formed on the light-receiving surfaces of the respective light-receiving elements, it is possible to change a transmittance of the dielectric element and adjust the receiving amount of light which is incident upon the light-receiving surfaces, whereby a full-fledged exposure adjusting function is realized. This structure is totally different in terms of principles from an image sensor, such as a CCD, which has the above-mentioned electronic iris function. Thus, the simple electric structure according to the invention realizes a full-fledged exposure adjusting function which parallels that of a mechanical structure.

To apply a voltage for adjusting a light-receiving amount to the discrete light-receiving amount adjusting electrodes, lines for adjusting the light-receiving amount may be formed on the surfaces of the substrates. However, in other preferred embodiment, to further simplify the structure of the substrates, the distance between the discrete light-receiving amount adjusting electrodes and the common electrode which faces the same is selected smaller than the distance between the pixel electrodes and the common electrode, whereby the displaying function is realized by applying a relatively high displaying voltage between the pixel electrodes for displaying and the common electrode during the displaying period, and by applying a relatively low voltage smaller than the threshold value which activates the dielectric element between the discrete light-receiving amount adjusting electrodes and the common electrode during the period of adjusting the light-receiving amount. Thus, the source lines for the thin film transistors which are formed on the surfaces of the substrates are also used for both displaying and adjusting the light-receiving amount, and therefore, the structure is simplified.

Further, according to the invention, a light source known as a back light is disposed in the back to obtain a structure for a so-called transmission display. In such a structure, to prevent light from the light source from malfunctioning the light-receiving elements, the light shielding layer of metal such as aluminum, a light shielding synthetic resin layer or the like is disposed in the rear of the light-receiving elements, i.e., between the light-receiving elements and the light source.

In the case the apparatus for displaying and imaging as described above according to the invention is applied to a television communication apparatus, it is possible for one to have a conversation in a natural state while looking at an image of a partner of the conversation at the same eye height as the partner.

In the apparatus for displaying and imaging according to the invention, in front of one of the pair of substrates which is disposed in front of an operator, a converging lens for focusing an image, such as the face of the operator, is disposed across a number of the light-receiving elements which are formed on the display/light-receiving surfaces. This allows the light-receiving elements to yield an electric signal which has a level which corresponds to the light intensity of each portion of the focused image. Further, due to the conversion lens, the operator can see an enlarged display image.

According to the invention, the electrodes for forming pixels are formed on each of the surfaces facing each other of the pair of substrates and the dielectric element is disposed between the substrates so that a displaying function is realized, a number of the light-receiving elements are arranged on the surfaces facing each other and the outputting means individually derives outputs from the light-receiving elements so that an imaging function is realized. This makes it possible to possible to perform imaging in the same region as a displaying region which realizes the displaying function. Hence, in application to a television communication apparatus, for instance, while an operator looks at a displayed image of the face of a partner of a conversation, the face of the operator is imaged, so that the operator can have the conversation in a natural manner at the same eye height with the partner. Thus, more natural user-interface and man-interface than prior arts are realized.

According to the invention, the outputting means for deriving outputs from the light-receiving elements is realized by a charge transfer device such as a CCD, so that the size of the structure is reduced. The structure is simplified in particular by using column shift registers which read outputs from the light-receiving elements in a parallel manner and shift the same as a serial bit and a row shift register which shifts an output of each shift register to a common output terminal as a serial bit and by transferring outputs from the light-receiving elements in an inter-line transmission method, for example.

Further, according to the invention, in order to attain a displaying function, to realize a displaying function, semiconductor switching elements such as thin film transistors are used to realize an active matrix display for performing dynamic displaying. The semiconductor switching elements and the light-receiving elements are arranged adjacent to each one of the pixel elements, to thereby improve a displaying quality. In addition, the light-receiving elements who are provided approximately as many as the pixel electrodes are used to improve an imaging quality as well.

Further, according to the invention, the discrete light-transmitting electrodes for adjusting the amount of received light are formed on the light-receiving surfaces of the respective light-receiving elements to change a transmittance of the dielectric element which performs a displaying function as well, disposed between the discrete light-receiving amount adjusting electrodes and the common electrode, to adjust the receiving amount of the light which is incident upon the light-receiving surfaces. Hence, it is possible to provide a full-fledged function of adjusting the light-receiving amount, namely the exposure, which is radically different from an incident light amount increasing structure which has an iris function of a CCD using an electric shutter which has been described above in relation to the prior arts, by means of a small-sized, low-cost, and lightweight structure as compared with a mechanical structure which is conventionally used in a camera. Further, according to the invention, since there is no mechanical driving portion, the reliability is improved.

According to the invention, to apply a voltage to the discrete light-receiving amount adjusting electrodes, lines for adjusting the light-receiving amount may be formed along and adjacent to the source lines which are disposed for displaying. However, according to the invention, lines such as the source lines for displaying in particular are used for adjustment of the light-receiving amount as well, the distance between the discrete light-receiving amount adjusting electrodes and the common electrode which faces the same is selected smaller than the distance between the pixel electrodes and the common electrode, a voltage lower than the displaying voltage which is applied during the displaying period is applied to the discrete light-receiving amount adjusting electrodes during the period of adjusting the light-receiving amount, not to activate the dielectric element between the pixel electrodes and the common electrode, but to activate the dielectric element disposed between the discrete light-receiving amount adjusting electrodes and the common electrode to change a transmittance of the dielectric element. Thus, adjustment of the light-receiving amount is realized with a further simplified structure.

Further, according to the invention, in a structure for a so-called transmission display in which a light source known as a back light is disposed in the back for the purpose of displaying, light from the light source is prevented from reaching the light-receiving elements, and hence, malfunction of the light-receiving elements is prevented. This realizes a further advanced composite apparatus which combines displaying by means of liquid crystal and an image sensor function.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
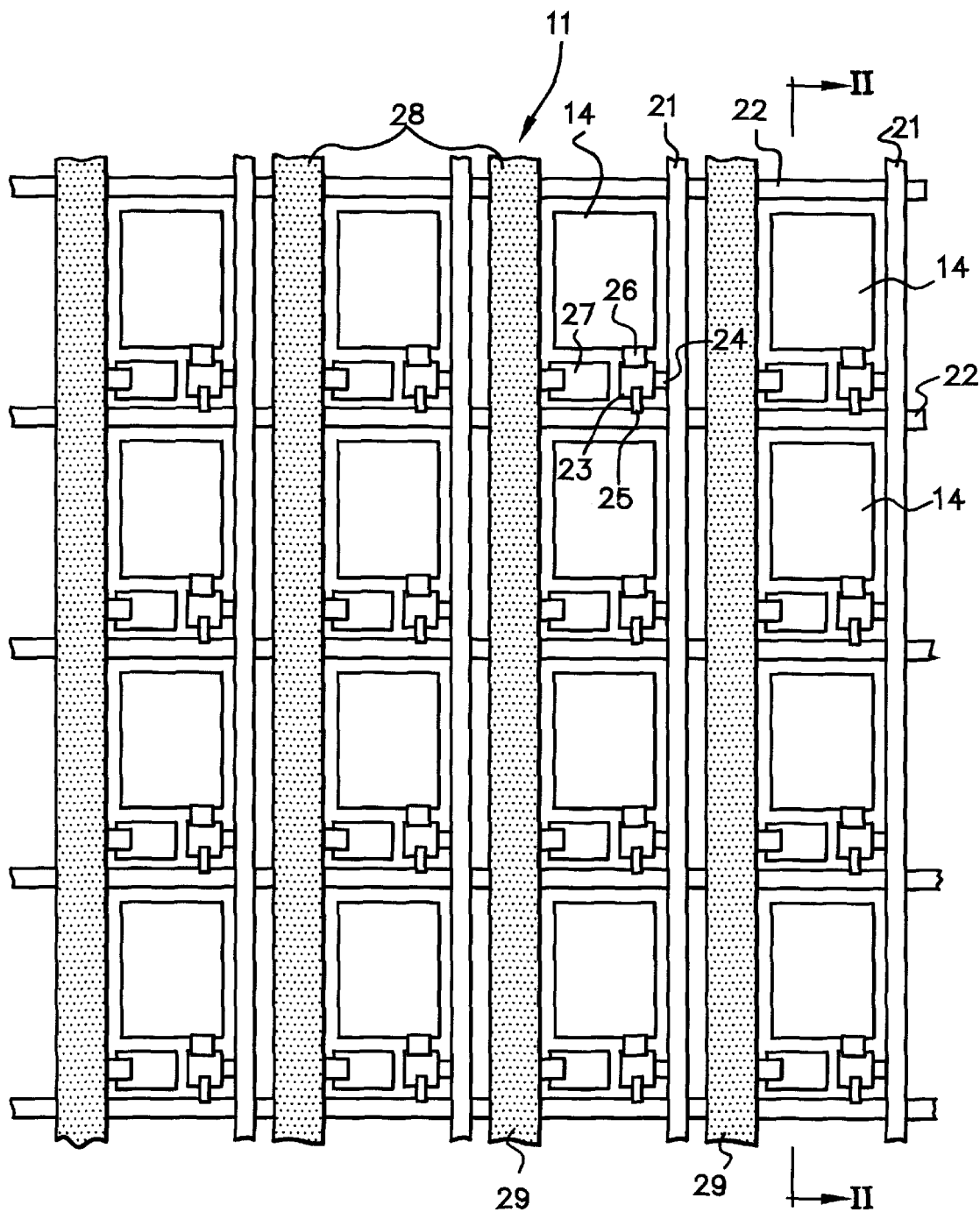
FIG. 1 is a plan view showing a portion of an apparatus 11 for displaying and imaging according to a preferred embodiment of the invention.

Now referring to the drawings, preferred embodiments of the invention are described below.

Figure 2:
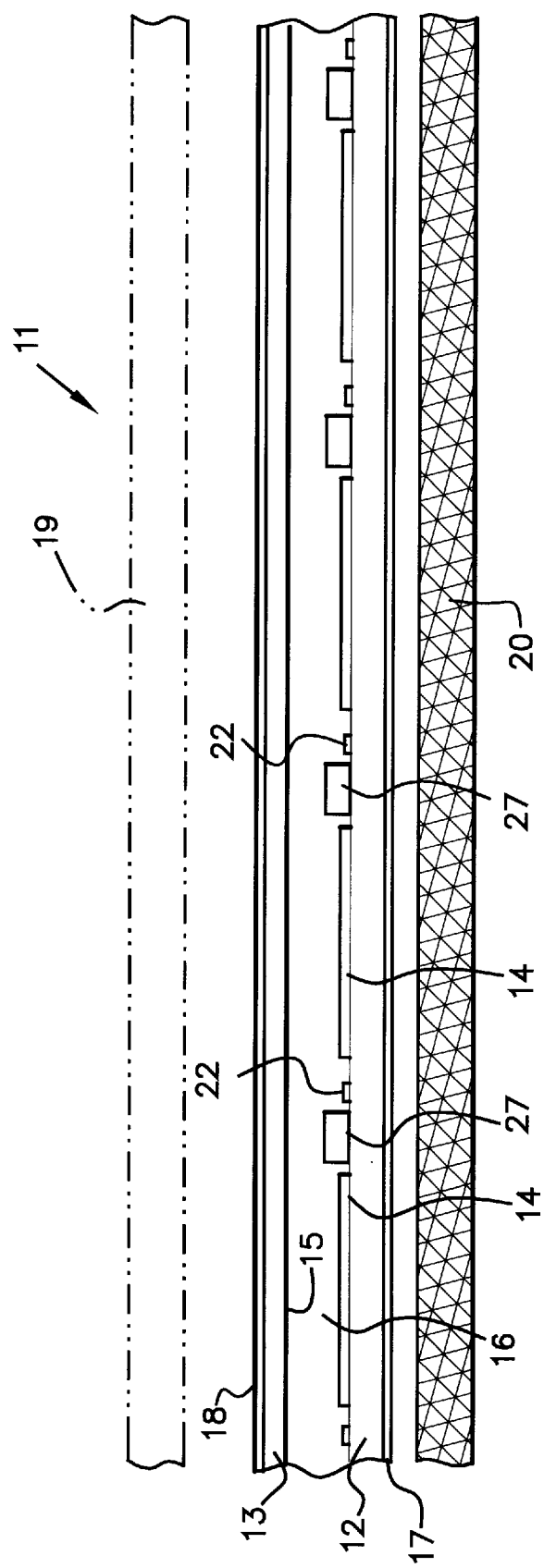
FIG. 2 is a simplified cross sectional view of the apparatus 11 for displaying and imaging as viewed along a cross sectional line II—II in FIG. 1.

FIG. 1 is a plan view showing a portion of an apparatus 11 for displaying and imaging according to a preferred embodiment of the invention, and FIG. 2 is a simplified cross sectional view of the apparatus 11 for displaying and imaging as viewed along a cross sectional line II—II in FIG. 1. In a television communication apparatus such as a picture telephone, for example, an apparatus for imaging which includes light-receiving elements which are photodiodes is integrally combined with a transmission type active matrix liquid crystal display apparatus which is dynamically driven, whereby the apparatus for displaying and imaging according to the invention is realized. On surface facing each other of a pair of substrates 12, 13 which are disposed with a distance from each other and which are made of a light transmitting electrically insulation material such as transparent glass are formed pixel electrodes 14 for achieving a displaying function and a common electrode 15 which is common to the pixel electrodes 14, respectively. A dielectric member, i.e., liquid crystal 16, is interposed between the substrates 12, 13. Polarization plates 17, 18 are formed on external surfaces of the substrates 12, 13.

On a front side which is an operator's side (upper part in FIG. 2), a conversion lens 19 is disposed. Hence, a real image to be imaged, such as the face of an operator, is focused at the surface of the substrate 12 which faces the liquid crystal 16, and the image which is displayed by the liquid crystal 16 is enlarged and seen as an enlarged image on the front side. A plane light source 20 which serves as a back light is disposed to the back of the substrate 12 (lower part in FIG. 2).

Referring to FIG. 1 again, the pixel electrodes 14 are arranged in the form of a matrix on the surface of the substrate 12 which faces the liquid crystal 16. The pixel electrodes 14 and the common electrode 15 are made of a light transmitting conductive material such as ITO (indium tin oxide). A plurality of gate lines 21 which extend in a column direction and a plurality of source lines 22 which extend in a row direction are formed on the surface of the substrate 12.

Thin film transistors 23, i.e., semiconductor switching elements, which are formed by metal oxide semiconductor field effective transistors (abbreviated as "MOS FET") each has a source electrode 25 which is connected to the source lines 22, a gate electrode 24 which is connected to the gate lines 21, and a drain electrode 26 which is connected to the pixel electrodes 14. In the thin film transistors 23, responding to a control voltage of one level which is selectively applied to the gate electrodes 24 from the gate lines 21, the source electrodes 25 and the drain electrode 26 are brought into conduction, so that a displaying voltage which is applied to the source lines 22 is applied to the discrete electrodes 14. The thin film transistors 23 are shut off when a voltage having other level is applied to the gate lines 21, whereby the voltage which is applied to the source lines 22 is not applied to the pixel electrodes 14. In this manner, during a period in which the displaying voltage is applied to each one of the source lines 22 sequentially, in accordance with an image to be displayed, the control voltage of the one level is selectively applied to the gate lines 21 sequentially and scanned, so that the liquid crystal 16 which is interposed between a desired one of the pixel electrodes 14 and the common electrode 15 is activated and displaying is performed pixel by pixel. The displaying voltage which is applied to the source lines 22 is set as a voltage which is equal to or larger than a threshold value which activates the liquid crystal.

Between the source lines 22 which are adjacent in the column direction (i.e.. a vertical direction in FIG. 2) of the pixel electrodes 14, the thin film transistors 23 and light-receiving elements 27 which are photodiodes for imaging are arranged. Like the pixel electrodes 14, the light-receiving elements 27 are arranged with regularity in the form of a matrix.

To individually lead outputs from the light-receiving elements 27, outputting means 28 as follows is disposed.

Figure 3:
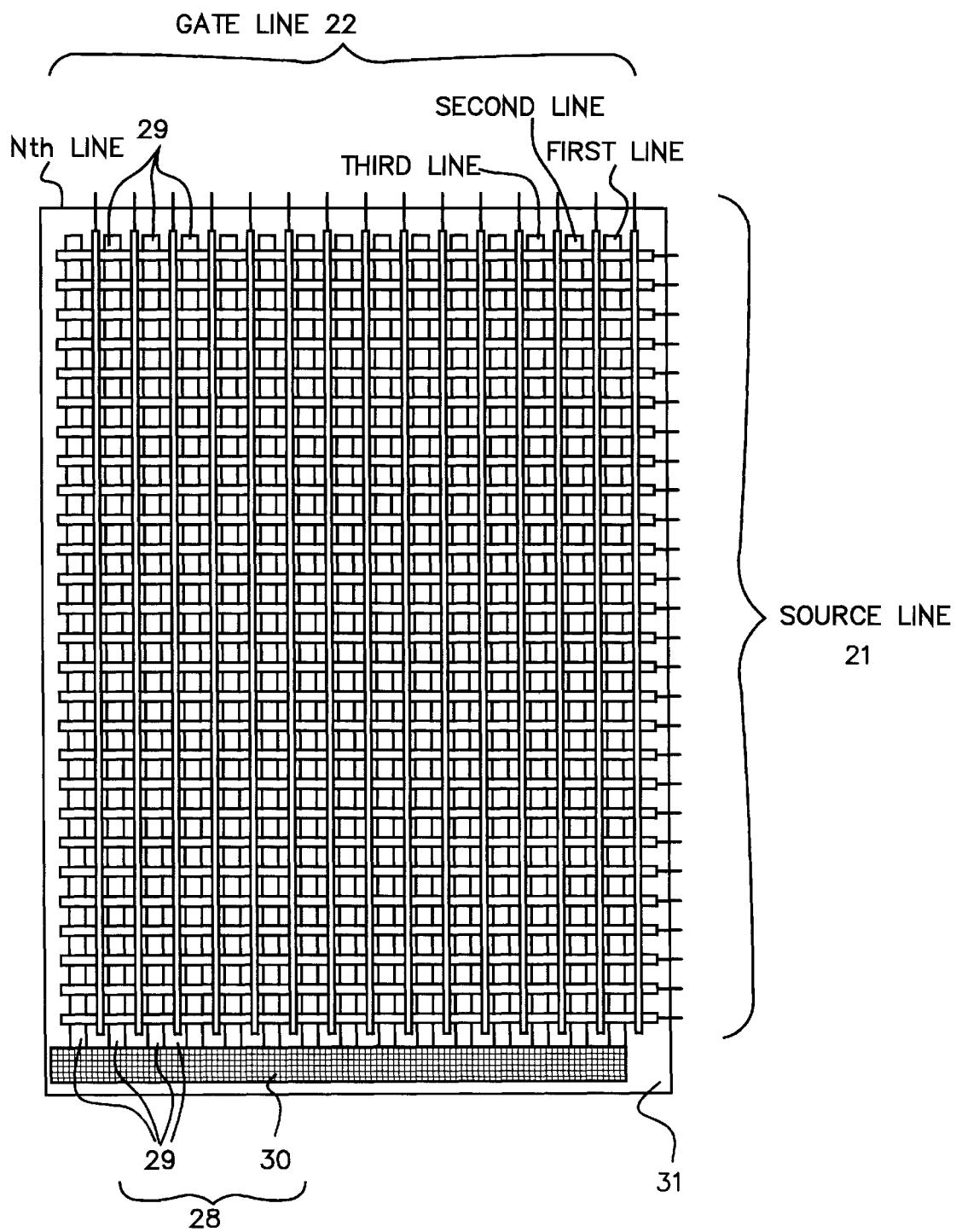
FIG. 3 is a simplified plan view of one substrate 12 as viewed from liquid crystal 16 side.

FIG. 3 is a simplified plan view of the substrate 12 as viewed from the liquid crystal 16 side. FIG. 1 described earlier is a plan view which enlarges a portion of the structure which is shown in FIG. 3. The outputting means 28 is formed by a semiconductor. The outputting means 28 includes column shift registers 29 for reading out outputs from the light-receiving elements 27 in a parallel manner and shifting the outputs as a serial bit by transferring the outputs in the column direction from above to below in FIGS. 1 and 2, and a row shift register 30 for sequentially leading outputs of the column shift registers 29 as a serial bit. The row shift register 30 yields outputs of the column shift registers, i.e., outputs from all of the light-receiving elements 27. In this manner, a so-called interline transmission method is realized.

Figure 4:
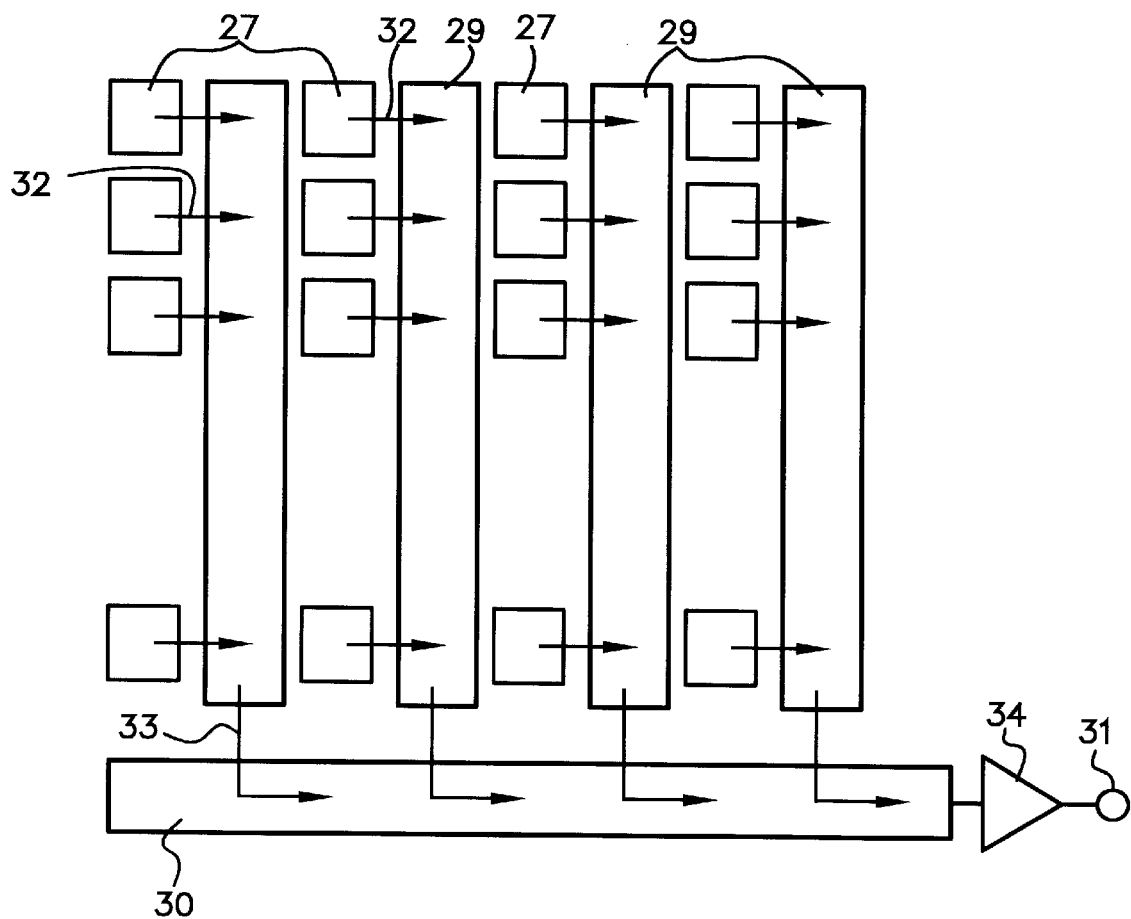
FIG. 4 is a simplified plan view of a structure of outputting means 28.

FIG. 4 is a simplified plan view of the structure of the outputting means 28. The column shift registers 29 reads out outputs from the light-receiving elements 27 which are arranged in the column direction corresponding to the thin film transistors 23 all at once column by column as indicated by an arrow 32, transfers the outputs column shift register by column shift register to the row shift register 30 as indicated by an arrow 33, and leads through the outputs. Between the row shift register 30 and an output terminal 31, an amplification circuit 34 which is realized by a semiconductor element is interposed.

Figure 5:
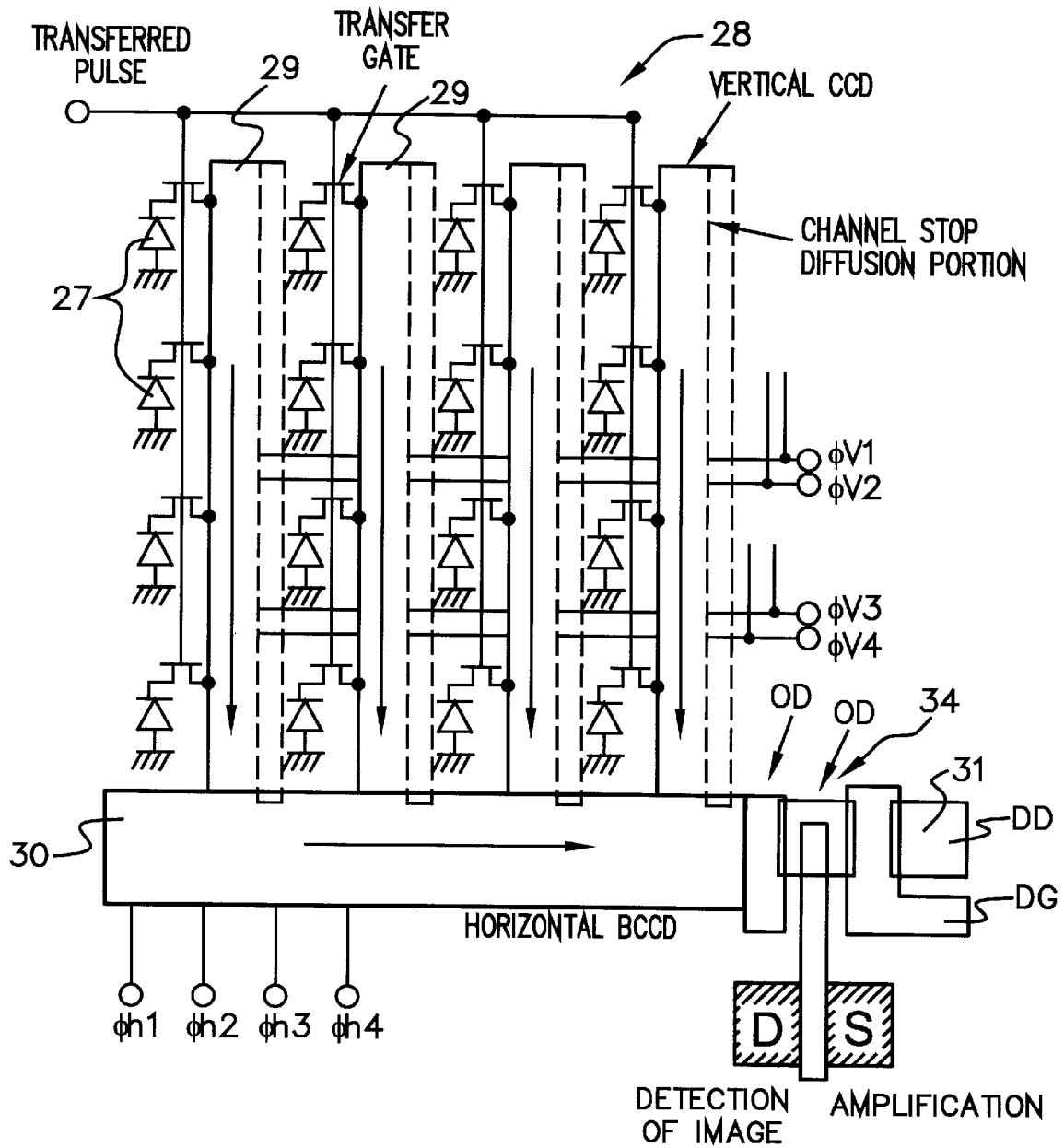
FIG. 5 is an electric circuitry view specifically showing a structure for outputting a signal from a light-receiving element 27 of FIG. 4 in further details.

FIG. 5 is an electric circuitry view further specifically showing a structure for outputting signals from the light-receiving elements 27 of FIG. 4. Due to a charge accumulating operation, electric charges of the signals which are generated by the light-receiving elements 27 are accumulated at coupling capacitances. Upon an accumulation period, the signal charges corresponding to all pixels are all sent at the same time to the neighboring column shift registers 29 which perform vertical transfer. Following this, the signal charges are transferred to a lower portion which is shown in FIGS. 4 and 5, in synchronization to column clock pulses $\phi v1$ to $\phi v4$ which are applied to the column shift registers 29. For reading out to the output terminal 31, charges covering one column of the column shift registers 29 are sent to the row shift register 30 which uses a buried channel to perform horizontal transfer, and serially outputted. Row clock pulses $\phi h1$ to $\phi h4$ are used for transfer of the signal charges by the row shift register 30. Upon reading out of the signal charges of one field, the signal charges of the next field which are accumulated at the light-receiving elements 27 are serially transferred to the output terminal 31 and read thereat in a similar manner. The entire screen is repeatedly scanned in this manner.

Figure 6:
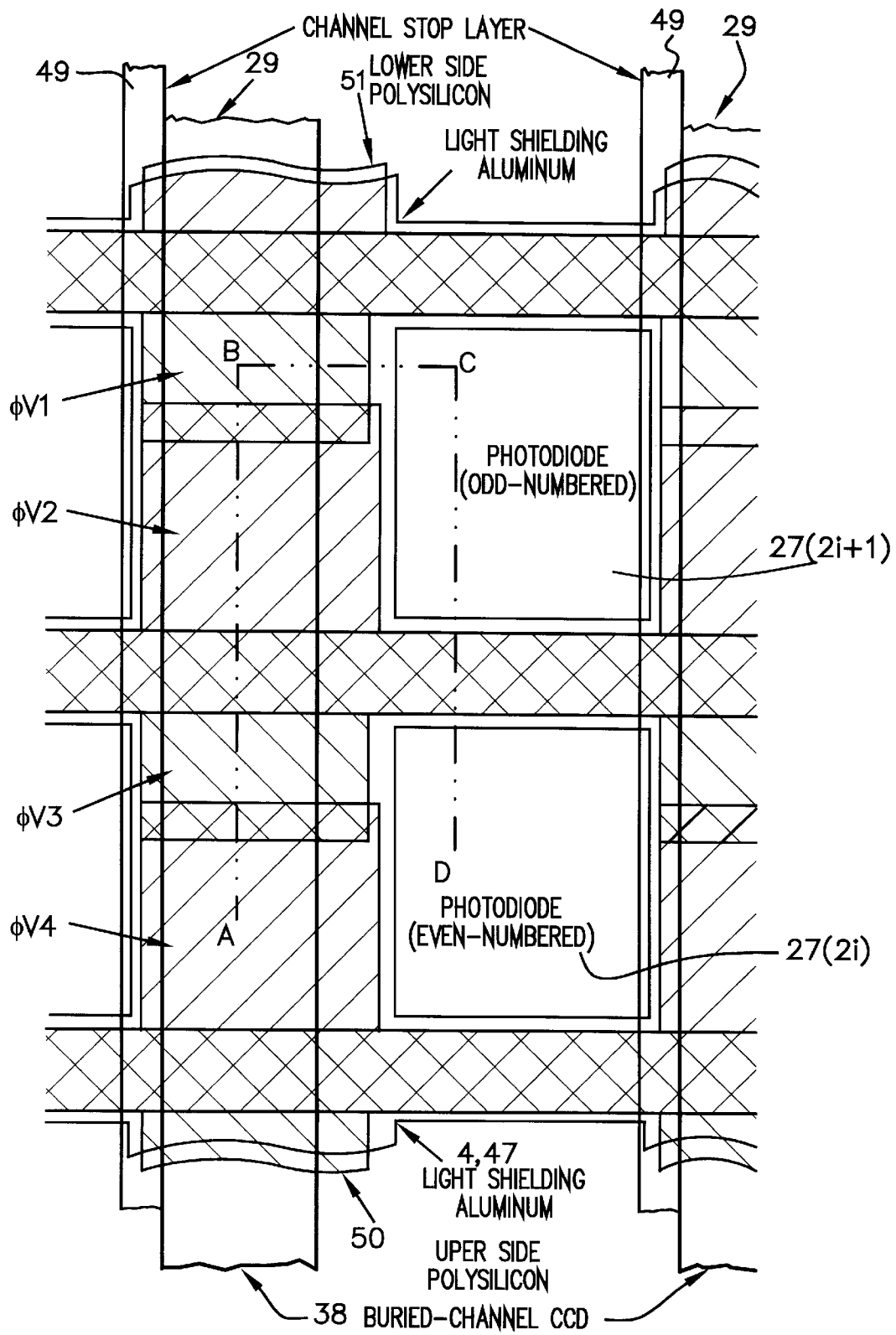
FIG. 6 is a plan view showing a specific structure of the light-receiving element 27 and a column shift register 29.
Figure 7:
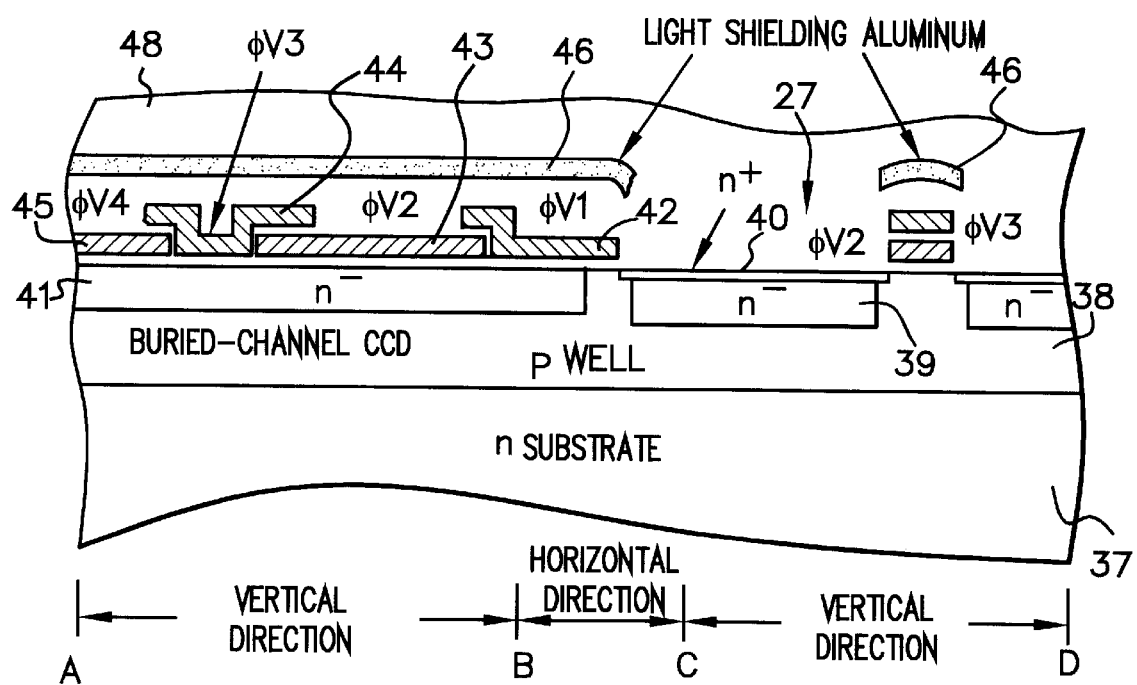
FIG. 7 is s cross sectional view of FIG. 6 as it is taken along a cross sectional line A-B-C-D.

FIG. 6 is a plan view showing a specific structure of the light-receiving elements 27 and the column shift registers 29, with slated lines in a portion of the drawing for convenience for understanding. FIG. 7 is a cross sectional view of FIG. 6 as it is taken along a cross sectional line A-B-C-D. The column shift registers 29 and the row shift register 30 are all buried-channel CCDs having a dual polysilicon polymerized gate electrode structure and perform transfer by a four-layer driving method. The amplification circuit 34 is formed by a charge detection diode of a floating diffusion layer and a two-stage source follower. Two light-receiving elements in total, one being an odd-numbered light-receiving element 27 (2i+1) and the other being an even-numbered light-receiving element 27 (2i), correspond to one bit in the column shift registers, where i is a natural number.

On the substrate 12, an n-type layer 37 of a semiconductor made of a material such as Si is formed at a position where the column shift registers 29 are to be formed, and a p-type well layer 38 is formed on the n-type layer 37. An n$^-$ region 39 is formed in the p-type well layer 38 and an n$^+$ layer 40 is formed on the n$^-$ region 39, whereby the light-receiving elements 27 are formed by an n$^+$n$^-$pn structure. The n$^-$ region 39 serves as an exit path through which excessive charges which are generated with strong light entered exit to the n-type layer 37, and also contributes to a medium frequency path and a change in a spectral path. In such an n$^+$n$^-$pn structure, even during suppression of blooming, an effective photoelectric conversion region is ensured down to the lower end of the n-region 39.

Further, to obtain the buried-channel CCD structure for transfer of charges, an n$^-$ region 41 is formed in the p-type well layer 38. An electrode 42 for transferring charges from the light-receiving elements 27 and electrodes 43, 44 and 45 are formed in this order partially overlapped each other. In addition, a light shielding layer 46 of a light shielding material such as aluminum is formed.

On these semiconductor layers, as indicated at 48 in FIG. 7, a light transmitting electrical insulation layer of SiO$_2$, for instance, is formed. A channel stop layer 49 is formed in the vicinity of the light-receiving elements 27 which are along the respective columns, thereby preventing interference between the light-receiving elements 27. Further, polysilicon layers 50, 51 are formed, one above and the other below. The channel stop layer 49 allows a clock wire line to have a function as a field plate. The channel stop layer 49 is formed in the form as a line along the column shift registers 29, and separates the pixels in the horizontal direction, i.e., in a left-right direction in FIG. 6. An output signal for each pixel of an image which are led through at the output terminal 31 is generated as a television video signal such as an NTSC signal and a PAL signal and interlace-scanned for every other horizontal line, whereby two fields in total, i.e., an odd field and an even field, form one frame.

Figure 8A:
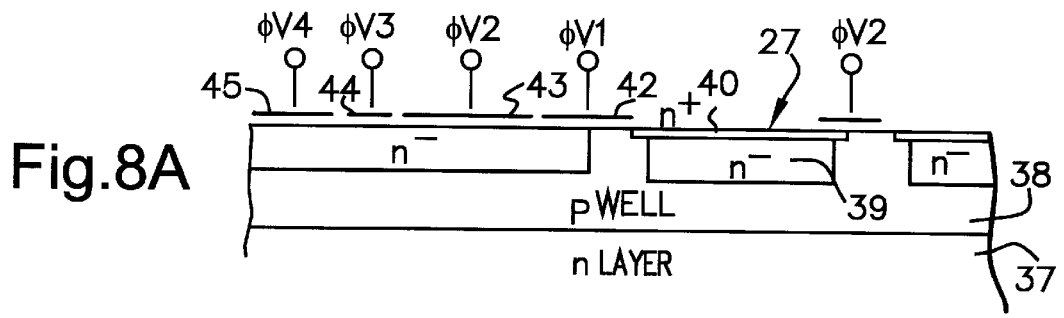
FIGS. 8A to 8D are time-sequential views showing a channel potential of each portion which is related to the light-receiving element 27 of FIG. 7.
Figure 8B:
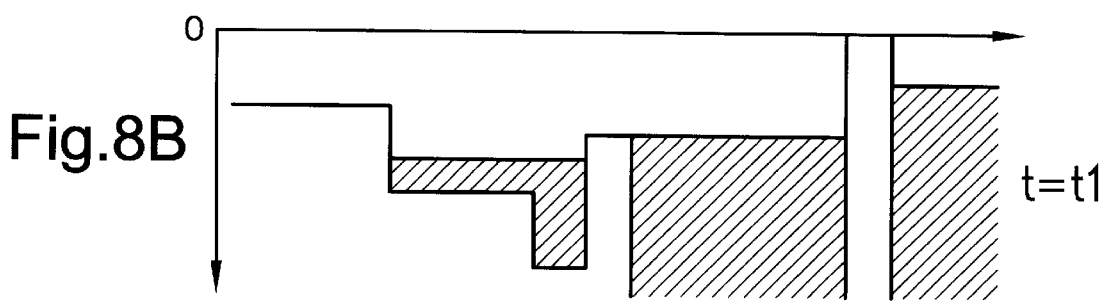
Figure 8C:
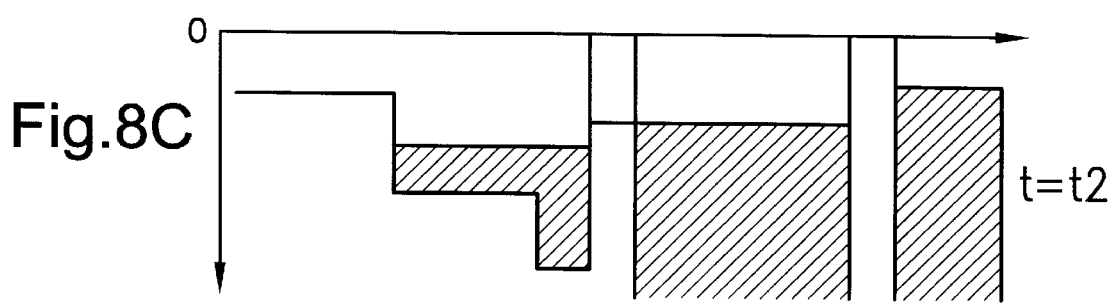
Figure 8D:
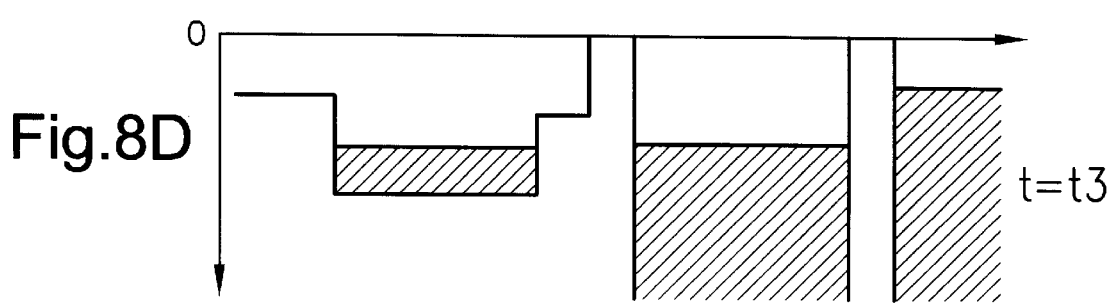

FIGS. 8A to 8D are time-sequential views showing a channel potential of each portion which is related to the light-receiving elements 27 of FIG. 7. Time points t=t1, t2, t3 which are shown in FIGS. 8B to 8D correspond to time points which are shown in FIGS. 9A to 9D. FIGS. 9A to 9D show column clock pulses φv1 to φv4 which are applied to the column shift registers 29. These column clock pulses are determined as voltages VH, VI, VL (VH>VI>VL), as time goes. The p-type well layer 38 is depleted due to a reverse bias voltage which is applied between the p-type well layer 38 and the n-type layer 37, which in turn suppresses not only blooming but a smear as well. Since the p-type well layer 38 is shallow not only at a lower portion of the light-receiving elements 27 but also at a lower portion of the column shift registers 29, as the p-type well layer 38 is completely depleted at these portions, electricity which is generated by photoelectric conversion is prevented from flowing into the column shift registers 29, so that a smear is avoided.

For introduction of drift of electrons into the column shift registers 29 from the light-receiving elements 27, drift is allowed to enter through the electrodes 42 to which the clock φv1 is supplied from the n$^+$ region 40 which is adjacent so that the electrons which are introduced in this manner causes transfer of potential movement from above toward below in FIG. 1 (that is, from above toward below in FIG. 6, or from the fight-hand side toward the left-hand side in FIGS. 7 and 8A. The portions shadowed with slant lines in FIGS. 8B to 8D indicate the electrons causing potential movement. At the time t1, upon application of the clock pulse φv1 having a voltage value of VH to the electrode 42 which is nearest to the light-receiving elements 27, electric charges are read out from the light-receiving elements 27 into the column shift registers 29. Following this, in response to the column clock pulses φv1 to φv4 which are applied at the respective time points t2, t3, . . . , electric charges are sequentially transferred. The row shift register 30 causes an electric charge which is transferred from one of a number of the column shift registers 29 to be supplied to the amplification circuit 34, in synchronization to the row clock pulses φh1 to φh4, and the amplification circuit 34 amplifies the electric charge.

Figure 9:
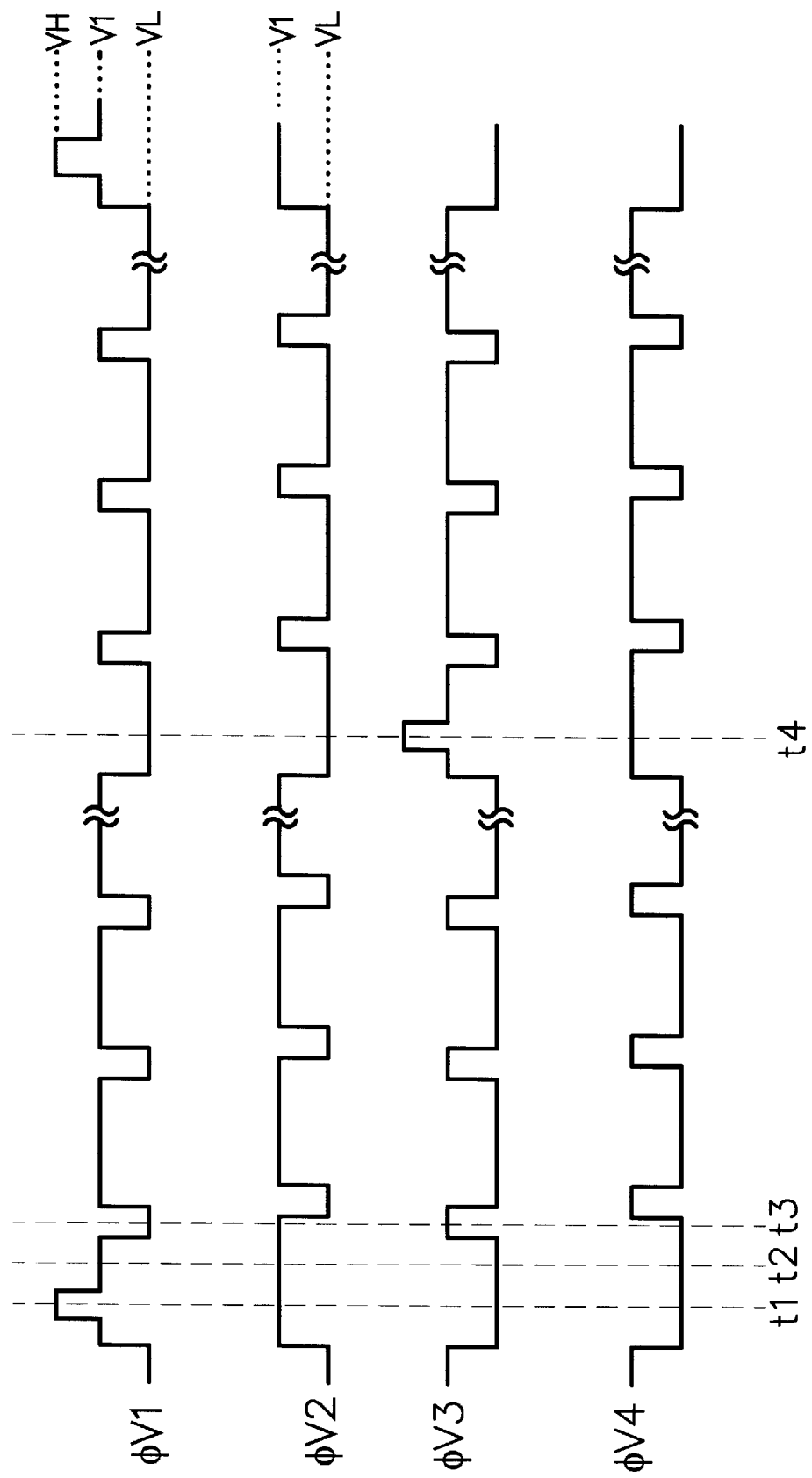
FIG. 9 is simplified waveform diagram for describing an operation of outputting means 30.
Figure 10:
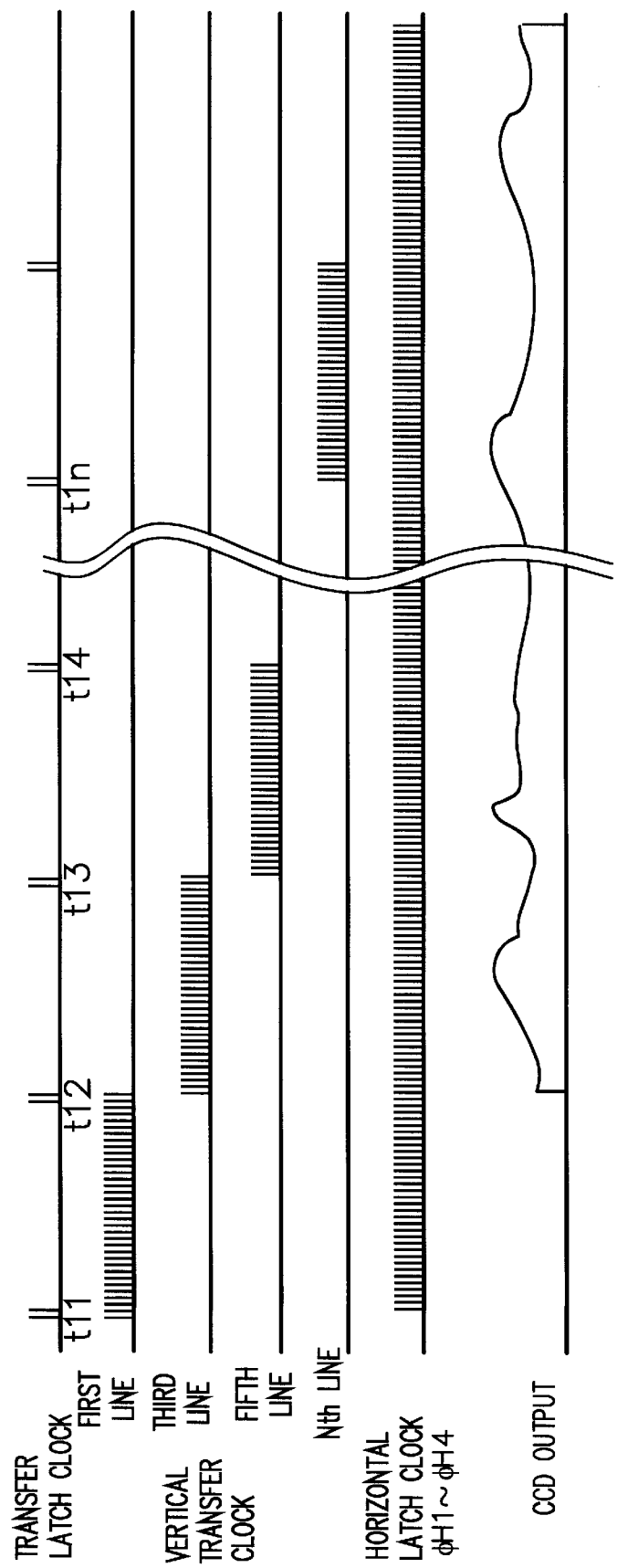
FIG. 10 is simplified diagram showing an entire operation in which an output from the light-receiving element 27 is read out at an output terminal 31.

FIG. 10 are simplified diagrams showing an entire operation in which outputs from the light-receiving elements 27 are read out at the output terminal 31. FIG. 10, which corresponds to the time t1 in FIGS. 8B and 9, shows an operation of reading out outputs from the light-receiving elements 27 to one column shift register 29 all at once and latching the outputs. FIG. 10 show an operation of sequentially shifting the outputs, which are read from the light-receiving elements 27 and stored in each column shift register 29, downward in FIGS. 4 and 5, for each one of the total n column shift registers 29 which are adjacent to each other in the row direction. In response to the row clock pulses φh1 to φh4, the row shift register 30 leads through outputs from the respective column shift registers 29 sequentially as a serial bit, as shown in FIG. 10. In this manner, signals which have levels corresponding to the amounts of received light of the light-receiving elements 27 are available at the output terminal 31, as shown in FIG. 10.

Figure 11:
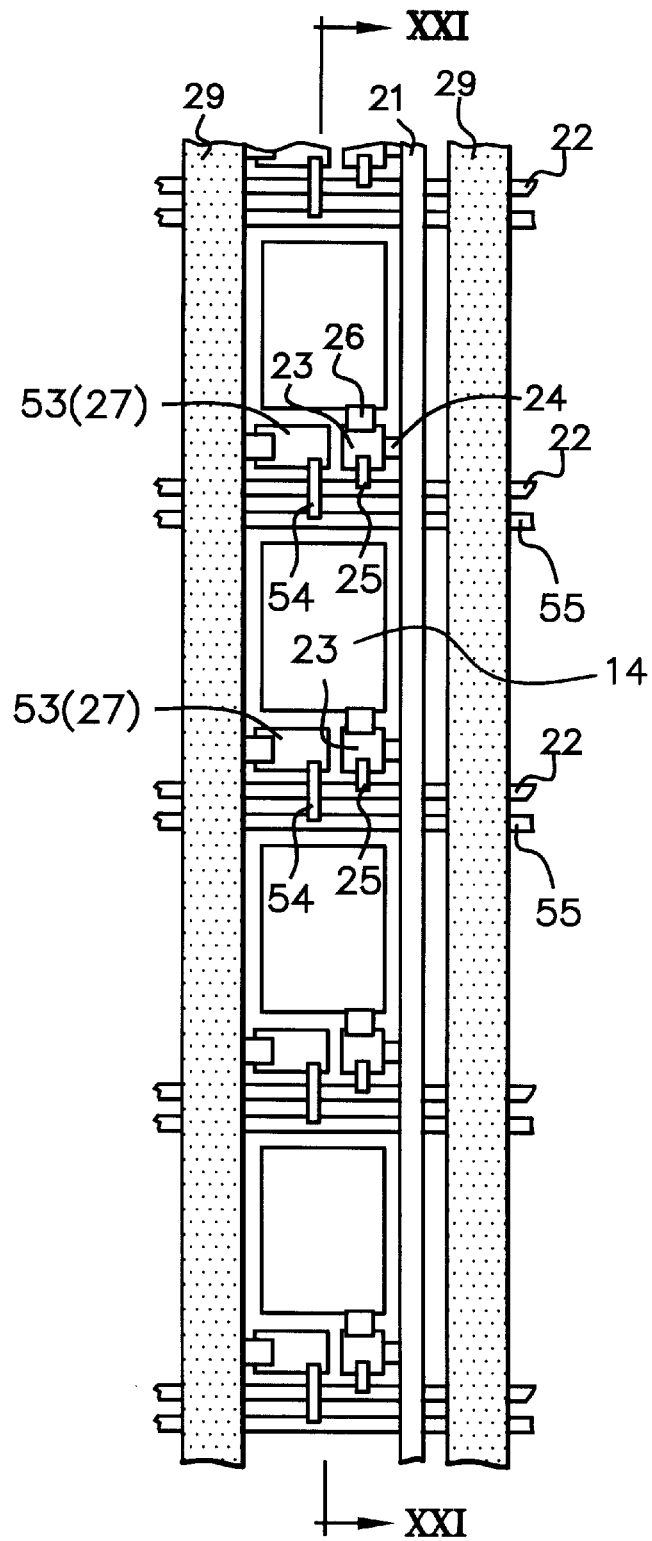
FIG. 11 is a partial plan view showing other preferred embodiment of the invention.
Figure 12:
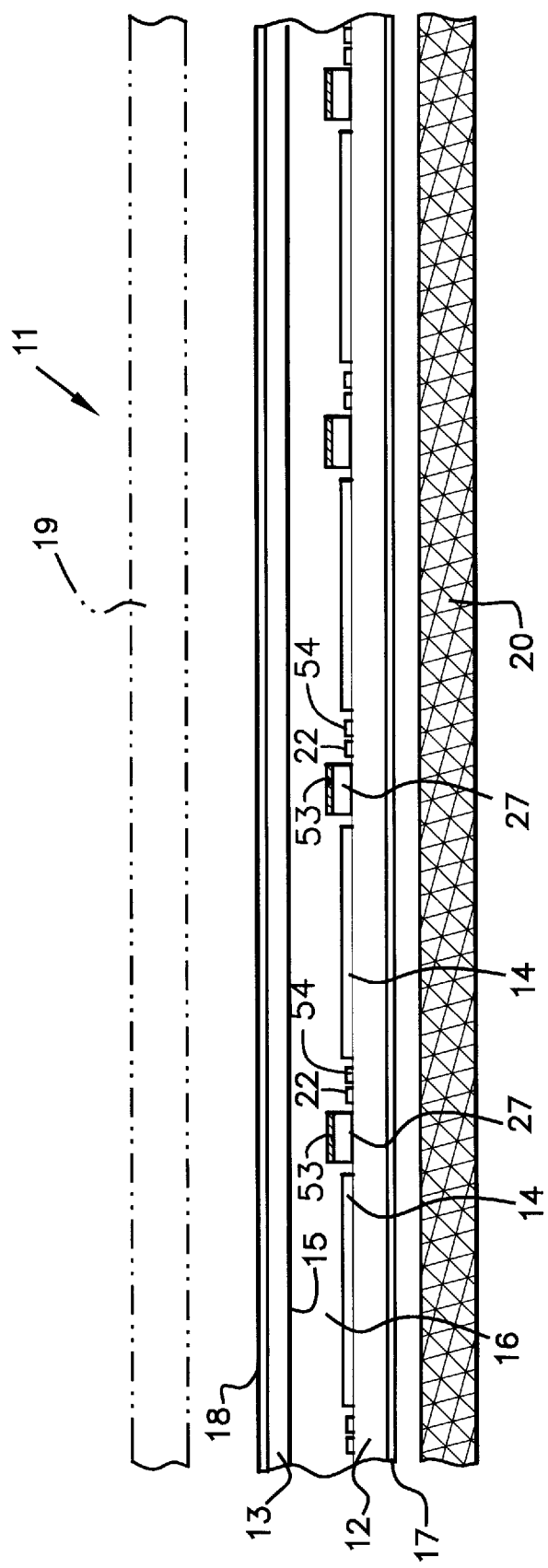
FIG. 12 is a simplified cross sectional view of FIG. 11 as it is taken along a cross sectional line XII—XII.

FIG. 11 is a partial plan view showing other preferred embodiment of the invention, and FIG. 12 is a simplified cross sectional view of FIG. 11 as it is taken along a cross sectional line XII—XII. As the illustrated preferred embodiment is similar to the preferred embodiment described above which is shown in FIGS. 1 to 10, identical reference symbols are assigned to corresponding portions. A point to be noted regarding the illustrated preferred embodiment is that the discrete light-transmitting electrodes 53 for adjusting the light-receiving amount are formed on the light-receiving surfaces of the light-receiving elements 27. The discrete electrodes 53 may be made of ITO, for example. The discrete electrodes 53 are connected through conductive elements 54 to lines 55 for adjusting the light-receiving amount. The lines 55 for adjusting the light-receiving amount are formed along and adjacent to the source lines 22, on the surface of the substrate 12 which seats the discrete electrodes 14 and the light-receiving elements 27. Disposed through the insulation layer 48 (See FIG. 7), the conductive elements 54 are electrically insulated from the source lines 22. The discrete light-receiving amount adjusting electrodes 53 ate formed on the light-receiving surfaces of the light-receiving elements 27 through the light-transmitting electrical insulation layer in this manner.

A signal for adjusting the light-receiving amount which is the same for all the discrete electrodes 53 is applied through the light-receiving amount adjusting line to the discrete light-receiving amount adjusting electrodes. Such an operation of adjusting the light-receiving amount is controlled by a control circuit, independently of a liquid crystal displaying operation. For instance, outputs from the light-receiving elements 27 and the output terminal 31 for the light-receiving elements 27 which is formed by the outputting means 28 is monitored and detected. When an output voltage which is obtained from the light-receiving elements 27 is too high or when the light-receiving elements 27 or the amplification circuit 34 is saturated, the voltage of the light-receiving amount adjusting signal is increased, to thereby activate the liquid crystal 22 interposed between the discrete electrodes 53 which are formed on the light-receiving elements 27 and the common electrode 15 and decrease the light transmittance, so that stronger application is obtained. This reduces the amount of light which impinges upon the light-receiving elements 27 and decreases the output voltage from the light-receiving elements 27. Conversely, when the output voltage from the light-receiving elements 27 is too low, the light-receiving amount adjusting voltage to be supplied to the light-receiving amount adjusting lines 55 is decreased, to thereby deactivate the liquid crystal 22 disposed on the light-receiving elements 27 and increase the light transmittance, so that the density is decreased. This increases the amount of light which impinges upon the light-receiving elements 27 and increases the output voltage from the light-receiving elements 27. Such a light-receiving amount adjusting voltage is successively changed, so as to successively adjust the output voltage from the light-receiving elements 27.

Figure 13:
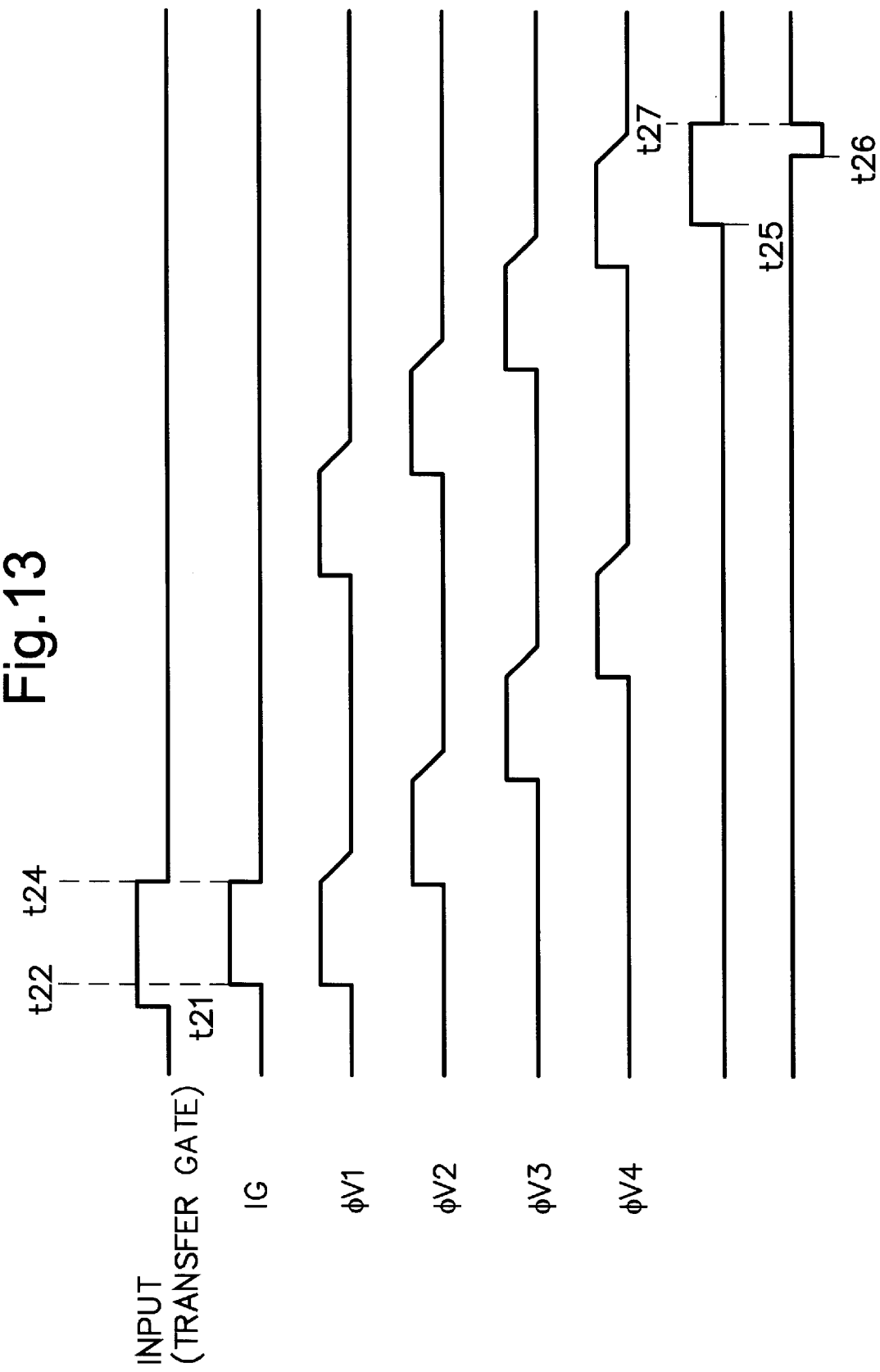
FIG. 13 is simplified diagram for describing an operation in the preferred embodiment which is shown in FIGS. 11 and 12.

FIG. 13 are simplified diagrams for describing an operation in the preferred embodiment which is shown in FIGS. 11 and 12. As shown in FIG. 13, the light-receiving amount adjusting voltage which changed to a high level during the time t2 to the time t24 is applied to the light-receiving amount adjusting lines 55, and consequently, the light transmittance of the liquid crystal 16, which is interposed between the discrete light-receiving amount adjusting electrodes 53 and the common electrode 15, is changed. In this condition, a pulse as that shown in FIG. 13 is supplied to the column shift registers 29 for the purpose of reading into the column shift registers 29 from the pixel electrodes 14, and the outputs from the column shift registers 29 originated from the light-receiving elements 27 are sequentially shifted, utilizing the column clock pulses φv1 to φv4 which are shown in FIG. 13, as a serial bit. Following this, outputs from the column shift registers 29 are transferred to the row shift register 30, and a signal as that shown in FIG. 13 is led through into the amplification circuit 34 from the outputting means 28 which includes the row shift register 30. At the output terminal 31, in response to a read signal as that shown in FIG. 13, a signal which has a level corresponding to the light-receiving amount of each light-receiving element 27 is outputted. The preferred embodiment which is shown in FIGS. 11 to 13 is otherwise similar in terms of structure and operation to the precedent preferred embodiment described earlier.

Figure 14:
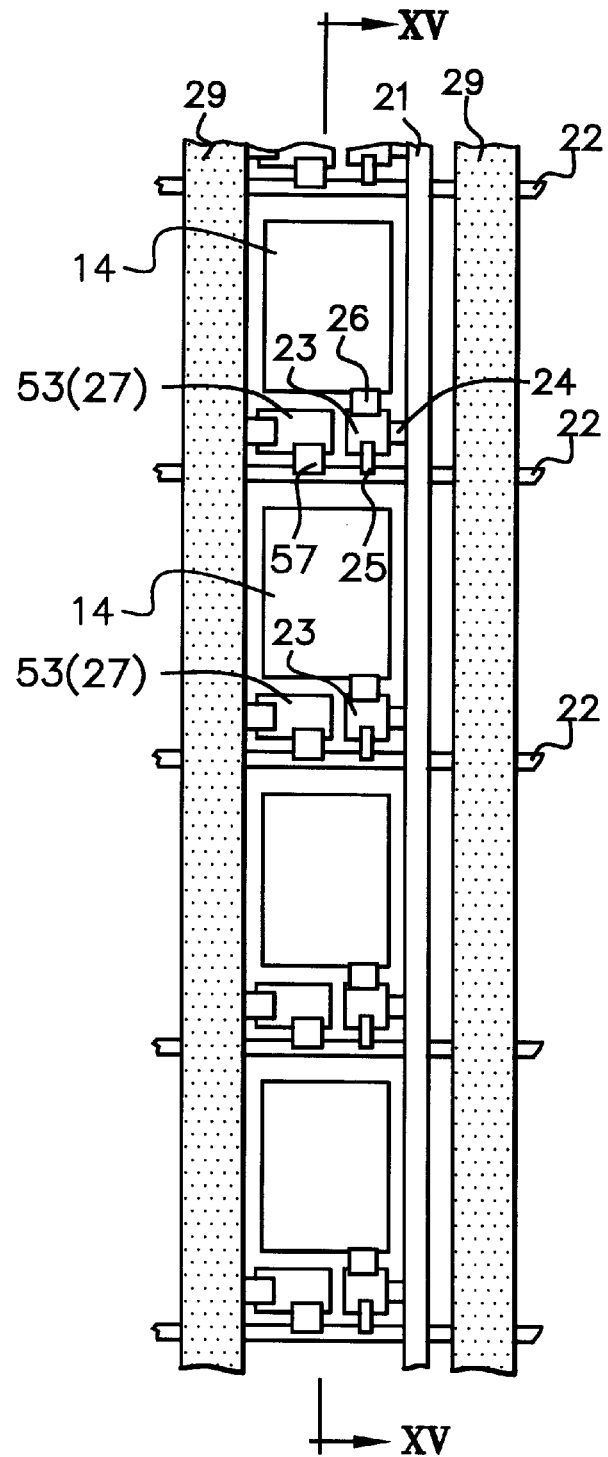
FIG. 14 is a plan view, which corresponds to FIGS. 1 and 11, showing still another preferred embodiment of the invention.
Figure 15:
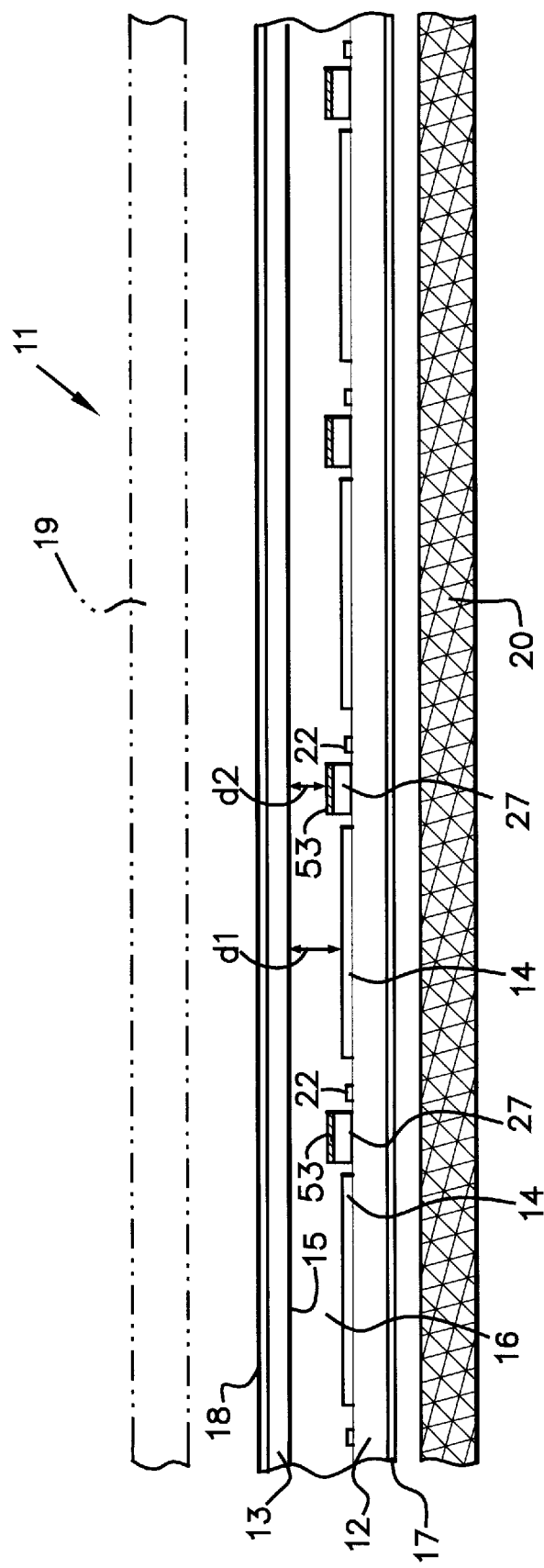
FIG. 15 is a partial cross sectional view of FIG. 14 as it is taken along a cross sectional line XV—XV.

FIG. 14 is a plan view, which corresponds to FIGS. 1 and 11, showing a still other preferred embodiment of the invention, and FIG. 15 is a partial cross sectional view of FIG. 14 as it is taken along a cross sectional line XV—XV. As the illustrated preferred embodiment is similar to the precedent preferred embodiment described earlier, identical reference symbols are assigned to corresponding portions. A point to be noted regarding the illustrated preferred embodiment is that discrete light-receiving amount adjusting electrodes 53 are electrically connected to the source lines 22 through conductive elements 57 and that the light-receiving amount adjusting lines 55 of the preferred embodiment described with reference to FIGS. 11 to 13 are omitted. This reduces the size of the apparatus of the invention and increases the mounting density of the pixel electrodes 14 and the light-receiving elements 27.

Figure 16:
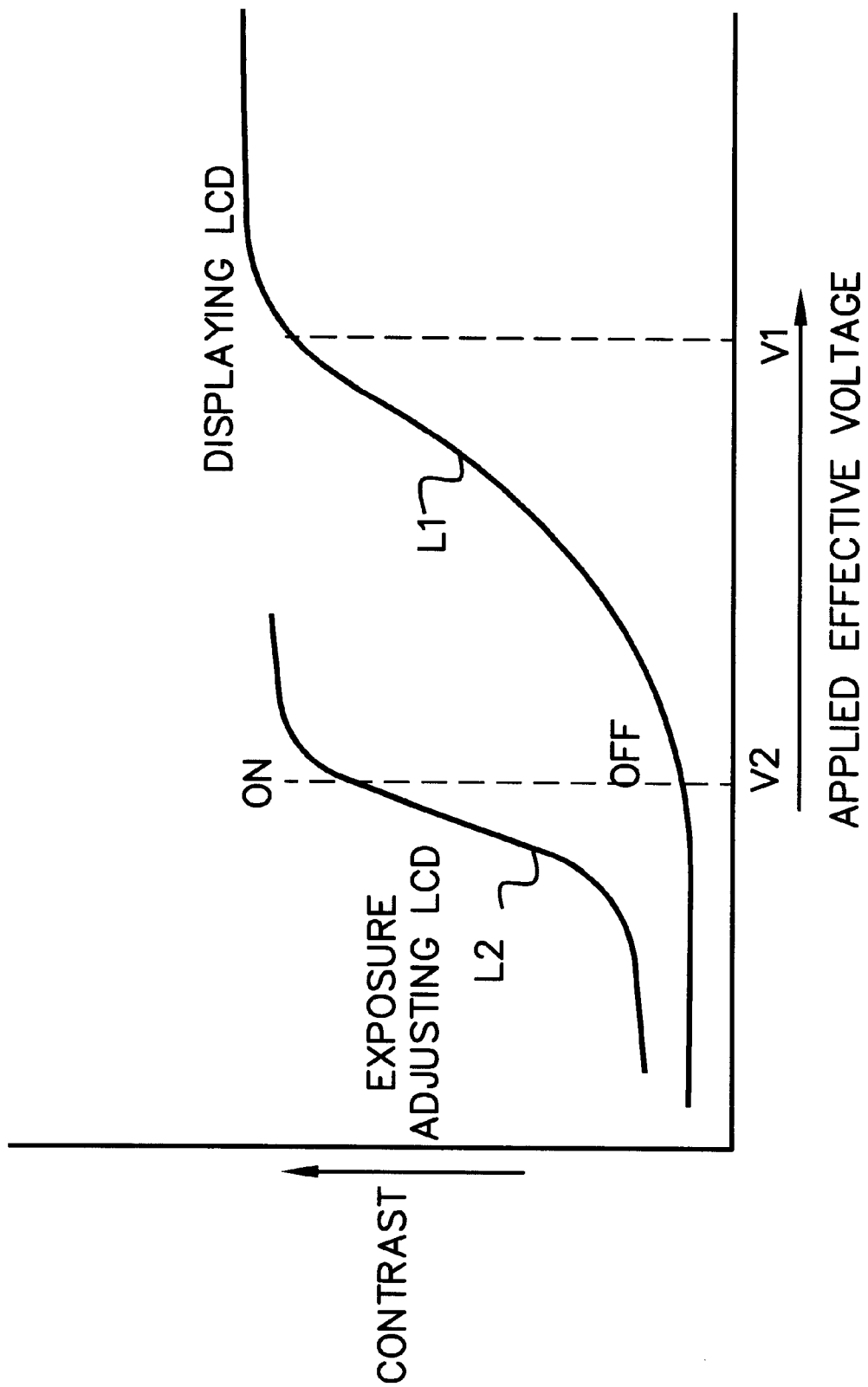
FIG. 16 is a graph showing a relationship between a voltage of an effective value which is applied to liquid crystal, and a contrast.
Figure 17:
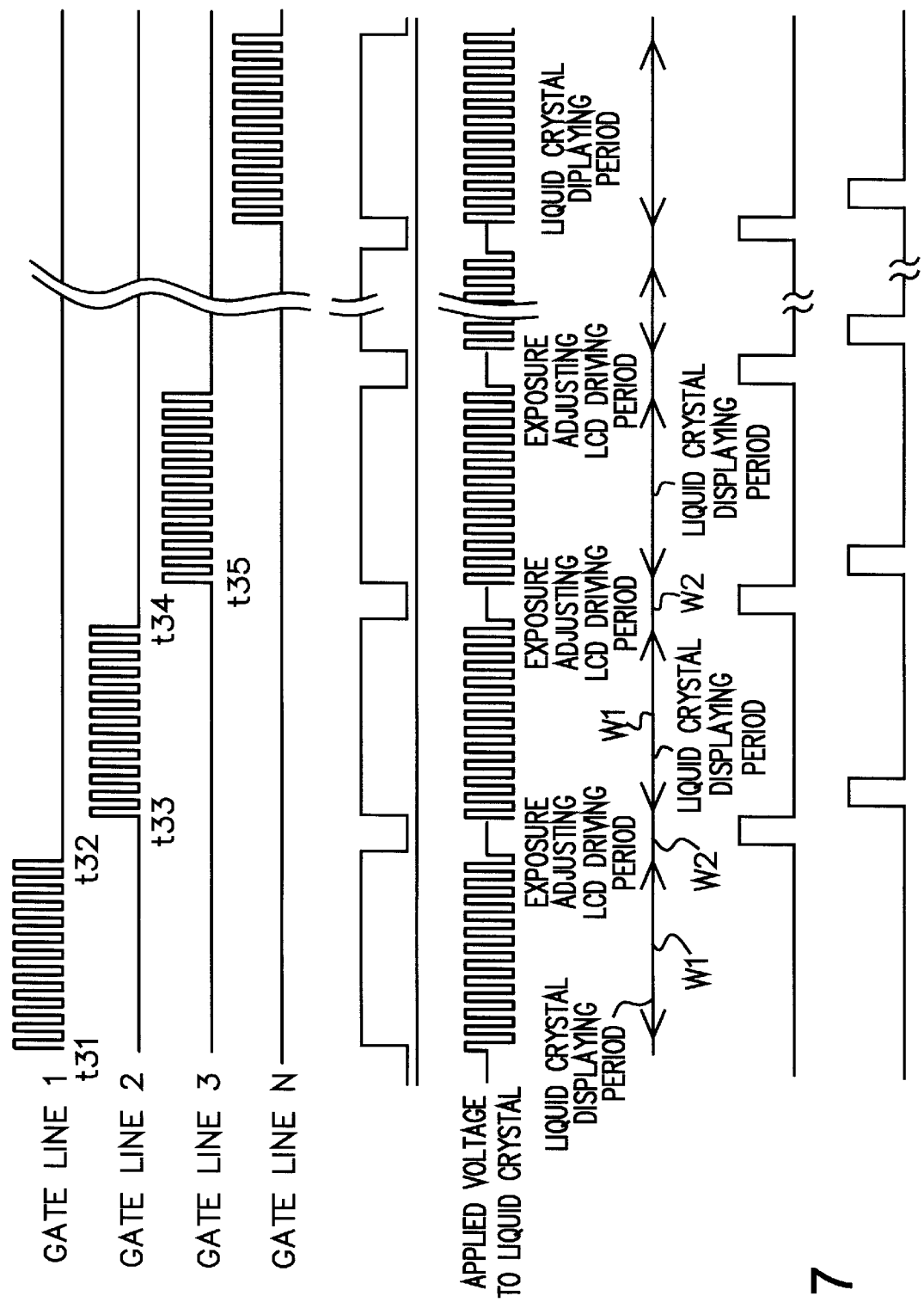
FIG. 17 is simplified waveform diagram for describing an operation in the preferred embodiment which is shown in FIGS. 14 to 16.

FIG. 17 are simplified waveform diagrams for describing an operation in the preferred embodiment which is shown in FIGS. 14 to 16. A control signal which has such a waveform as that shown in FIG. 17 and brings the thin film transistors 23 into conduction is supplied to n gate lines 21. The control signal is active only during a period W1 from time t31 to time t32 as shown in FIG. 17, and active only during another period W1 from time t33 to time t34 as shown in FIG. 17, for example. Thus, the period W1 is a displaying period in which the liquid crystal 16 between the pixel electrodes 14 and the common electrode 15 is activated and displaying is realized. A voltage which is applied to the liquid crystal 16 is as shown in FIG. 17.

From time t32 to time t33 between these displaying periods W1, a period W2 of adjusting the light-receiving amount is defined. The displaying periods W1 and periods W2 of adjusting the light-receiving amount are alternately defined as time passes. To the source lines 22, a displaying voltage V1 is applied to the common electrode 15 during the displaying periods W1 and a voltage V2 for adjusting the light-receiving amount is applied during the period W2 of adjusting the light-receiving amount. The condition in which the voltage which is shown in FIG. 17 is applied to one source line 22 is a condition in which the source lines 22 are sequentially scanned one by one and the voltage is applied to each source lines 22. Hence, as described above, the control voltage is sequentially scanned over the plurality of the gate lines 21.

During the period W2 of adjusting the light-receiving amount, the light-receiving amount adjusting voltage V2 which corresponds to the light transmittance of the liquid crystal 16 is applied to the discrete light-receiving amount adjusting electrodes 53 through the source lines 22 and the conductive elements 57. During the periods W2, an output corresponding to the light-receiving amount of each light receiving element 27 is shifted and read out to the column shift registers 29 in response to a read clock signal which is shown in FIG. 17(6), and are thereafter shifted through the column shift registers 29 and transferred during the displaying periods W1. The preferred embodiment is otherwise similar in operation to the precedent preferred embodiment described earlier.

In the preferred embodiment which is shown in FIGS. 14 to 17(8), during the periods W2 of adjusting the light-receiving amount, the control voltage is not applied to the gate lines 21 and hence the thin film transistors 23 are shut off. During the periods W2, the voltage which achieves a desired light transmittance of the liquid crystal 16 and hence desired amounts of received light at the light-receiving elements 27 is selected and applied through the source lines 22.

In still other preferred embodiment of the invention, in FIG. 15, the distance between the discrete light-receiving amount adjusting electrodes 53 and the common electrode 15 is selected to be smaller than the distance between the pixel electrodes 14 and the common electrode 15. That is, where the distance between the discrete light-receiving amount adjusting electrodes 53 and the common electrode 15 is d2 and the distance between the pixel electrodes 14 and the common electrode 15 is d1, $$d1 > d2 \tag{1}$$

is satisfied.

Hence, as shown in FIG. 16, a characteristic expressing a relationship between an effective voltage which is applied between the discrete light-receiving amount adjusting electrodes 53 and the common electrode 15 and the contrast of the liquid crystal 16 becomes a line L2, while a characteristic expressing a relationship between an effective voltage which is applied between the pixel electrodes 14 and the common electrode 15 and the contrast of the liquid crystal 16 becomes a line L1. The light-receiving amount adjusting voltage V2 is selected to be lower than the displaying voltage V1 for the pixel electrodes 14. In short, $$V1 > V2 \tag{2}$$

During application of the light-receiving amount adjusting voltage V2, the voltage is so selected that the liquid crystal 16 between the pixel electrodes 14 and the common electrode 15 is not activated.

Figure 18:
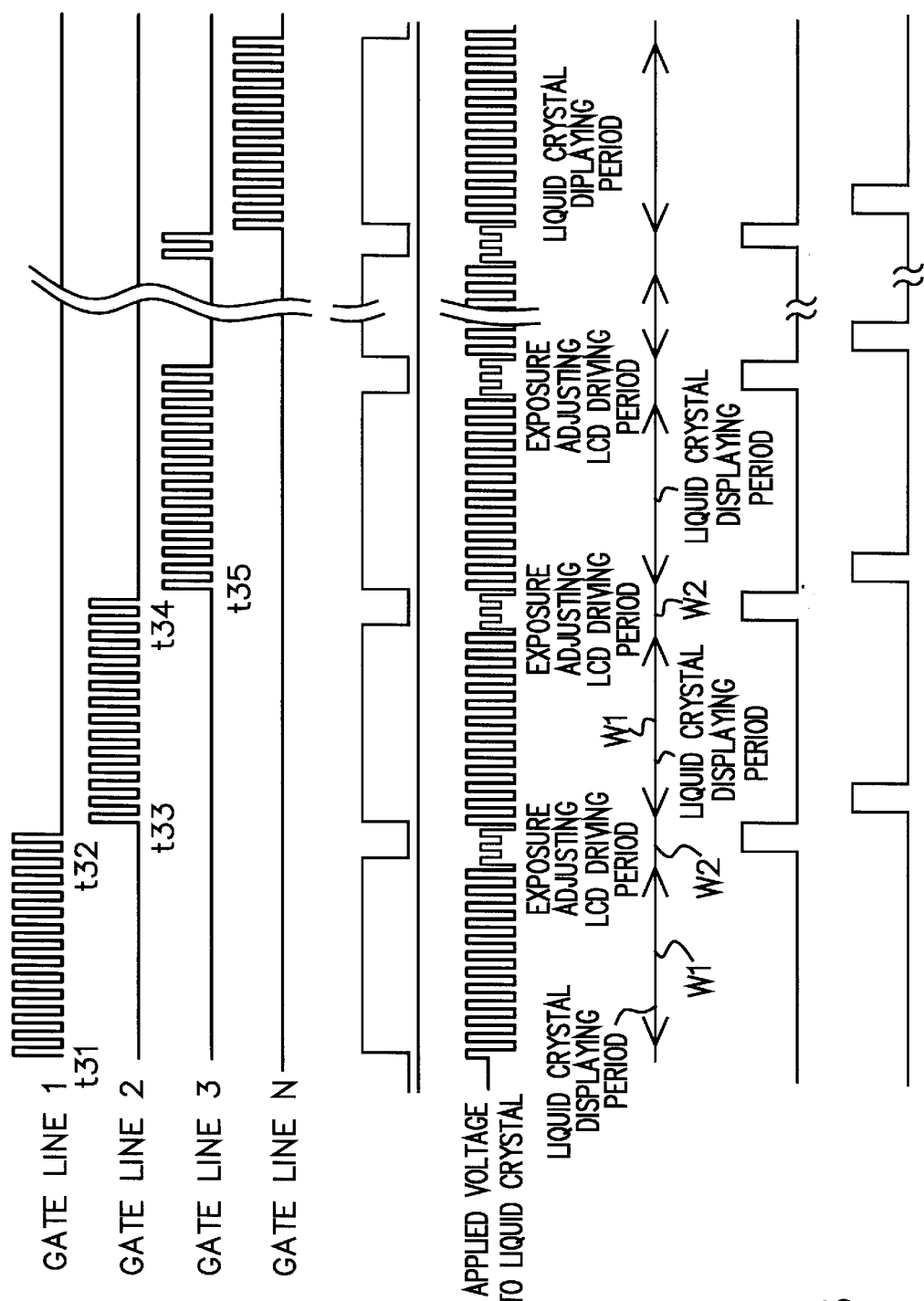
FIG. 18 is simplified waveform diagram for describing an operation in a still other preferred embodiment of the invention which is similar to the preferred embodiment which is shown in FIGS. 14 to 16.

An operation as that shown in FIG. 18 may be achieved utilizing a difference in the threshold voltage value for activating the liquid crystal 16 in accordance with the equation (1) described above. The waveforms shown in FIG. 18 respectively correspond to the waveforms shown in FIG. 17 described earlier. A point to be noted regarding the illustrated preferred embodiment is that a control voltage as that shown in FIG. 18 is always sequentially applied to the respective gate lines 21 and a voltage as that shown in FIG. 18 is always applied between the pixel electrodes 14 and the common electrode 15. During the periods W2 of adjusting the light-receiving amount, the voltage V2 which does not activate the liquid crystal 16 between the pixel electrodes 14 and the common electrode 15 is applied to the source lines 22, so that liquid crystal displaying is not performed. The preferred embodiment is otherwise similar in operation to each one of the precedent preferred embodiments described earlier.

In the preferred embodiment which is shown in FIGS. 14 to 17(8), d1=d2 may be satisfied.

Figure 19:
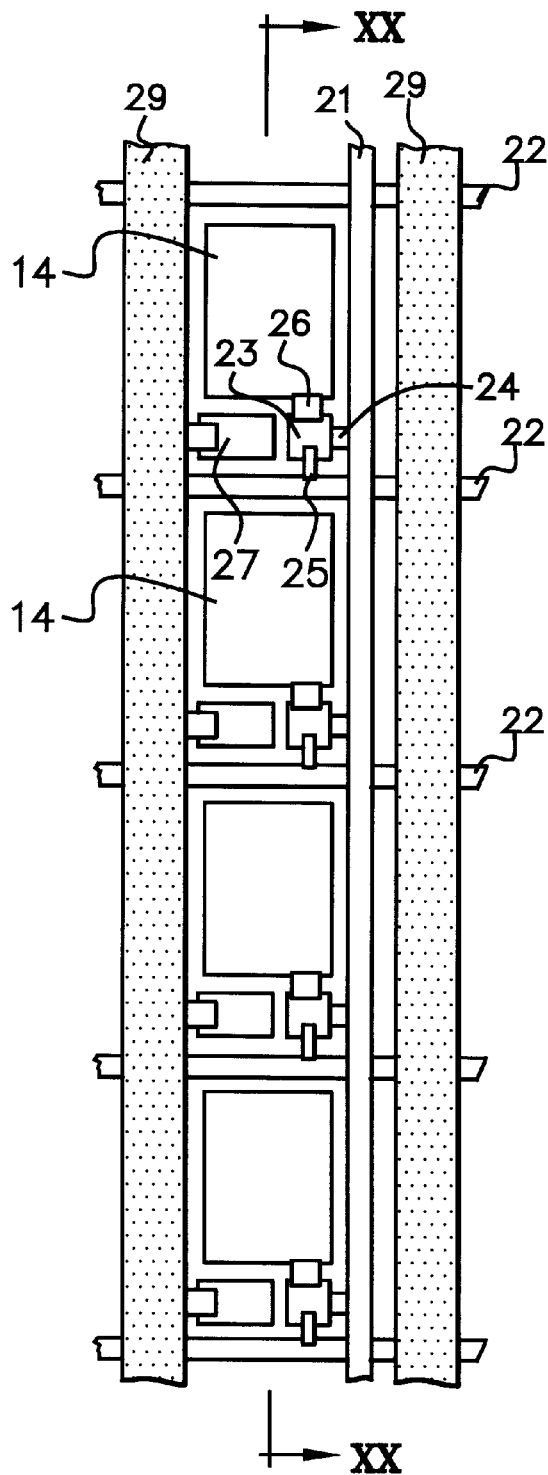
FIG. 19 is a partial plan view, which corresponds to FIG. 1, showing a still other preferred embodiment of the invention.
Figure 20:
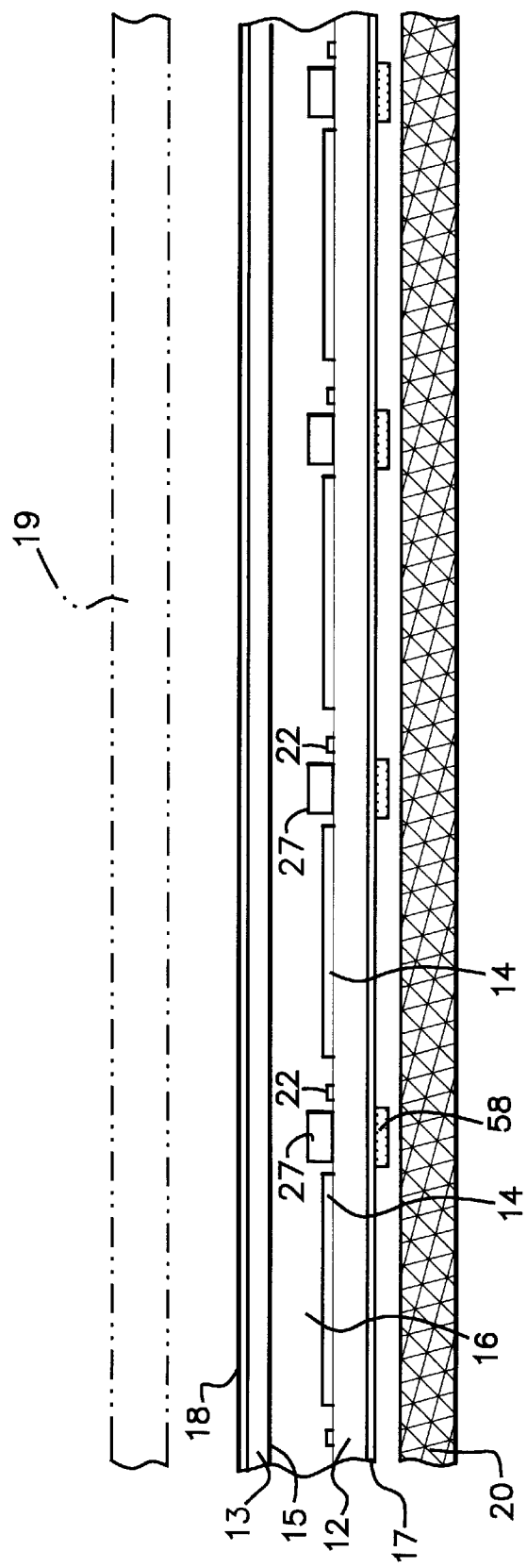
FIG. 20 is a cross sectional view of FIG. 19 as it is taken along a cross sectional line XX—XX.

FIG. 19 is a partial plan view, which corresponds to FIG. 1, showing a still other preferred embodiment of the invention, and FIG. 20 is a cross sectional view of FIG. 19 as it is taken along a cross sectional line XX—XX. The illustrated preferred embodiment is similar to the precedent preferred embodiment described earlier with reference to FIGS. 1 to 10. However, as to be noted, in the illustrated preferred embodiment, a light shielding layer 58 is formed in the rear of the light-receiving elements 27 on the substrate 12. The light shielding layer 58 may be formed by a metal deposition film of aluminum, for instance, or a light-shielding synthesized resin. This blocks light from the light source 20 upon the light-receiving elements 27 and hence prevents malfunction of the light-receiving elements 27.

Figure 21:
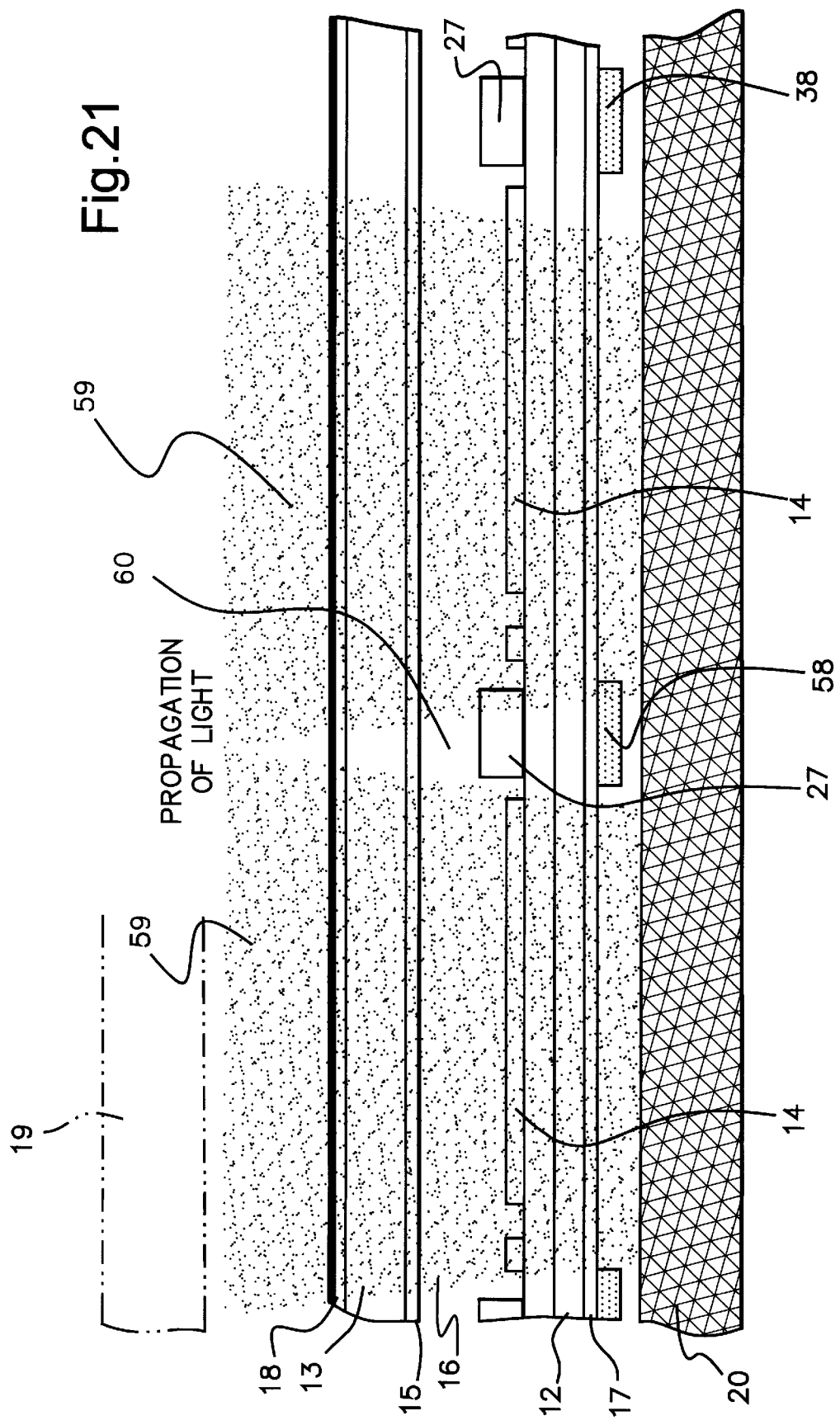
FIG. 21 is a simplified cross sectional view showing a light propagation path of light from a light source 20 according to the preferred embodiment which is shown in FIGS. 19 and 20.

FIG. 21 shows a light propagation path of light from the light source 20 in the preferred embodiment which is shown in FIGS. 19 and 20. Regions 59 with fine dots denote areas where light from the light source 20 propagates, while a white region 60 denotes an area where light from the light source 20 is not irradiated upon. From FIG. 21 as well, it is understood that the light shielding layer 58 prevents irradiation of light from the light source 20. This prevents malfunction of the light-receiving elements 27.

Figure 22:
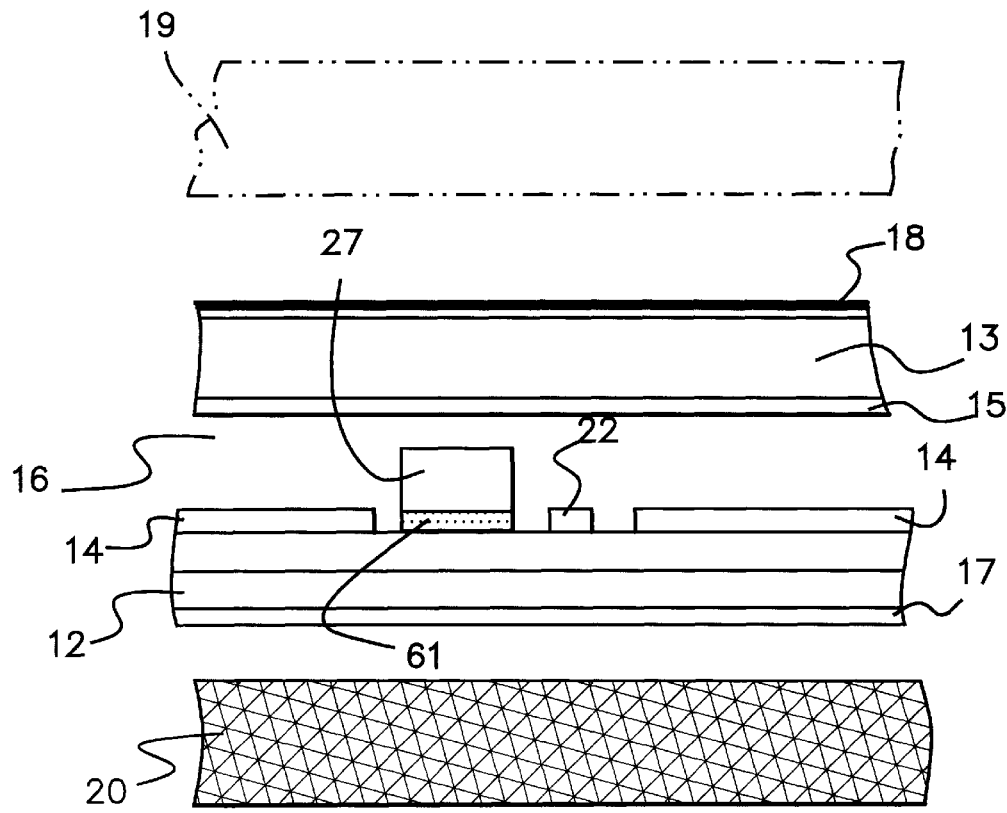
FIG. 22 is a partial cross sectional view showing another preferred embodiment of the invention.

FIG. 22 is a partial cross sectional view showing other preferred embodiment of the invention. Although the illustrated preferred embodiment is similar to the precedent preferred embodiment which is shown in FIGS. 19 to 21, a point to be noted regarding the illustrated preferred embodiment is that a light shielding layer 61 is formed on the surface of the substrate 12 which faces the liquid crystal 16 and that the light-receiving elements 27 are formed on the light shielding layer 61, which is formed in this surface, through the electrical insulation layer.

Figure 23:
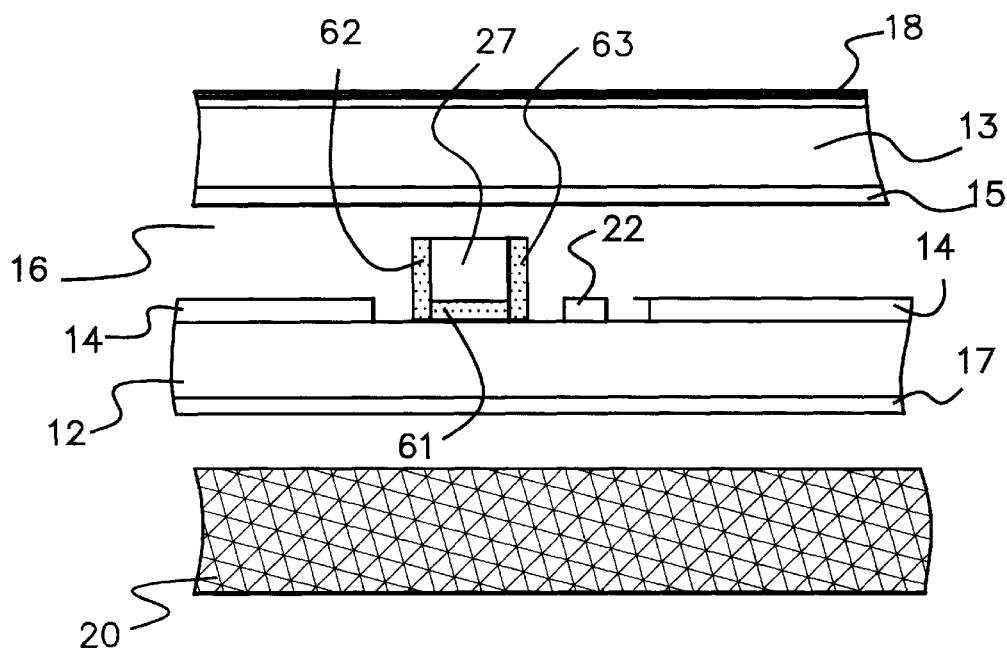
FIG. 23 is a partial cross sectional view showing still another preferred embodiment of the invention.

FIG. 23 is a partial cross sectional view showing still other preferred embodiment of the invention. The illustrated preferred embodiment is similar to the precedent preferred embodiments which are shown in FIGS. 19 to 22. To be noted, not only the light-receiving elements 27 are formed on the light shielding layer 61 which is formed on the substrate 12 but also light shielding layers 62, 63 are formed on the both sides of the light-receiving elements 27. The preferred embodiment is otherwise similar in operation to the precedent preferred embodiments described earlier. The light shielding layers 61 to 63 may be metal deposition layers, or alternatively, may be a non-conductive black organic material of a pigment dispersion type. The light shielding layers 58, 61 to 63 may be used in each one of the precedent preferred embodiments which are shown in FIGS. 11 to 18.

Figure 24:
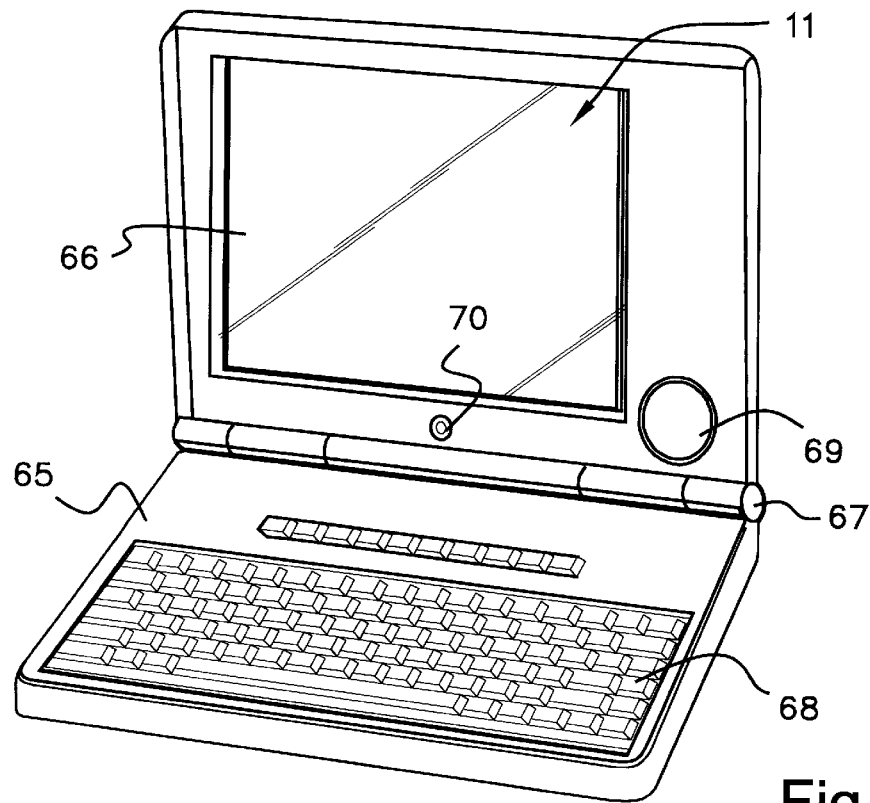
FIG. 24 is a simplified perspective view of a picture telephone which includes the apparatus 11 for displaying and imaging which is shown in FIGS. 1 to 10.

FIG. 24 is a simplified perspective view of a picture telephone 64 in the form of a so-called notebook personal computer which includes the apparatus 11 for displaying and imaging which is shown in FIGS. 1 to 10. The apparatus 11 includes a main unit 65 and a lid member 66 which can be opened and closed by means of a hinge 67 which has a horizontal axial line. A key board 68 including ten numerical key and the like for manipulation by an operator is formed in the main unit 65. The displaying/imaging apparatus 11 according to the invention is mounted to the lid member 66. Further, a speaker 69 and a microphone 70 which converts a voice of an operator into an electric signal are formed in the lid member 66. An operator can have a conversation while looking at an image, such as the face of other person, which is received through a telephone line and displayed in the apparatus 11. The image such as the face of the other person is imaged by the apparatus 11 and transmitted to the other person through a public telephone line 75.

Figure 25:
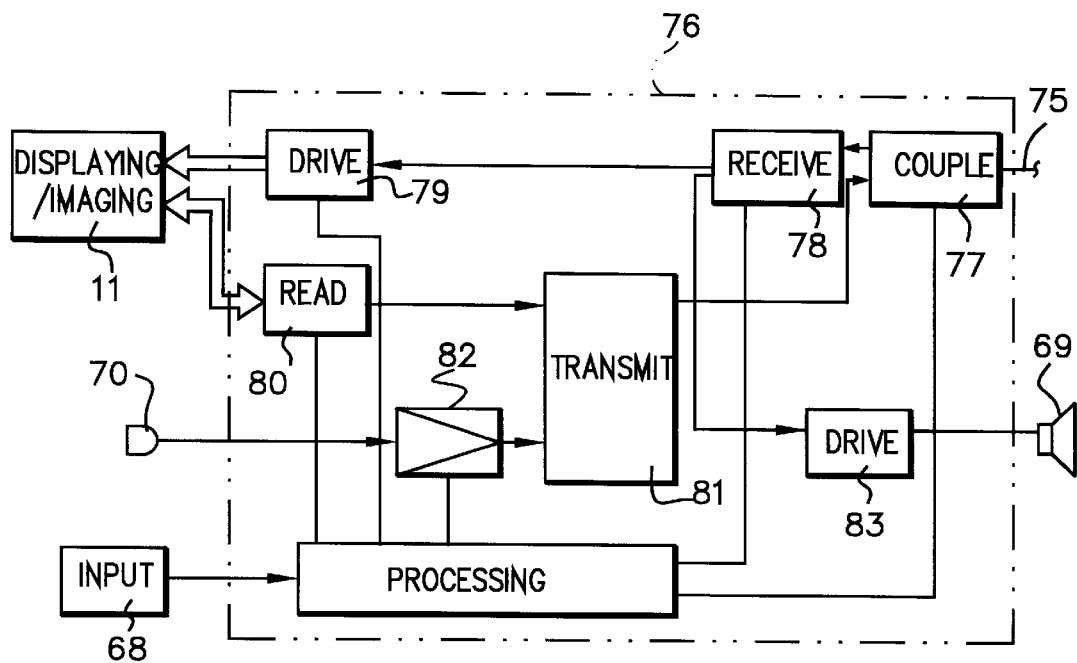
FIG. 25 is a simplified block diagram showing an electric structure of the picture telephone which is shown in FIG. 24.

FIG. 25 is a simplified block diagram showing an electric structure of the picture telephone 64 which is shown in FIG. 24. The public telephone line 75, i.e., a communication line, is connected to a receiver circuit 78 through a coupled circuit 77 which is formed in a control circuit 76. An image signal such as the face of the other person is supplied from the receiver circuit 78 to a drive circuit 79, so that the image is displayed by the displaying/imaging apparatus 11. An image signal, such as the face of the operator, which is imaged by the displaying/imaging apparatus 11 is supplied to the coupled circuit 77 from a transmitting circuit 81 through reading means 80 and transmitted to the public telephone line 75. A signal of a voice of the operator taken by the microphone 70 is amplified by an amplification circuit 82 and transmitted from the coupled circuit 77 to the public telephone line 75 through the transmitting circuit 81. An audio signal from the other person is supplied to a drive circuit 83 from the receiver circuit 78 so that the speaker 69 is driven. These elements 77 to 83 are controlled by a processing circuit 84 which is realized by a microcomputer or the like. A, dial signal or the like from the key board 68 is supplied to the processing circuit 84, whereby an operation of the processing circuit 84 is controlled.

The invention is applicable not only to an active matrix display apparatus which uses switching elements such as thin film transistors, but also to a so-called simple matrix display apparatus which is formed by disposing a number of row electrodes and a number of column electrodes at right angle through a dielectric element such as liquid crystal.

Figure 26:
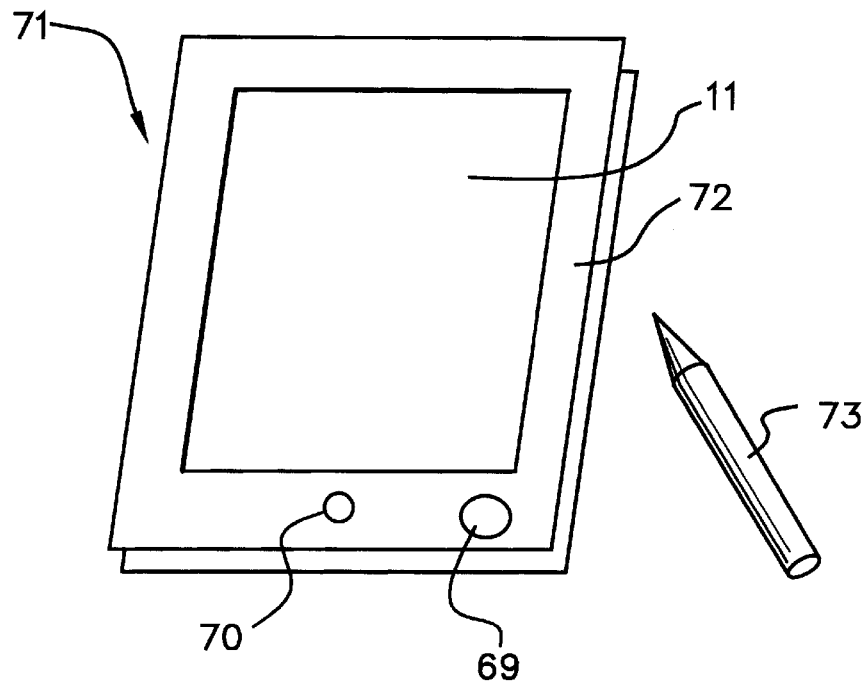
FIG. 26 is a simplified perspective view of a picture telephone 71 of still another preferred embodiment.
Figure 27:
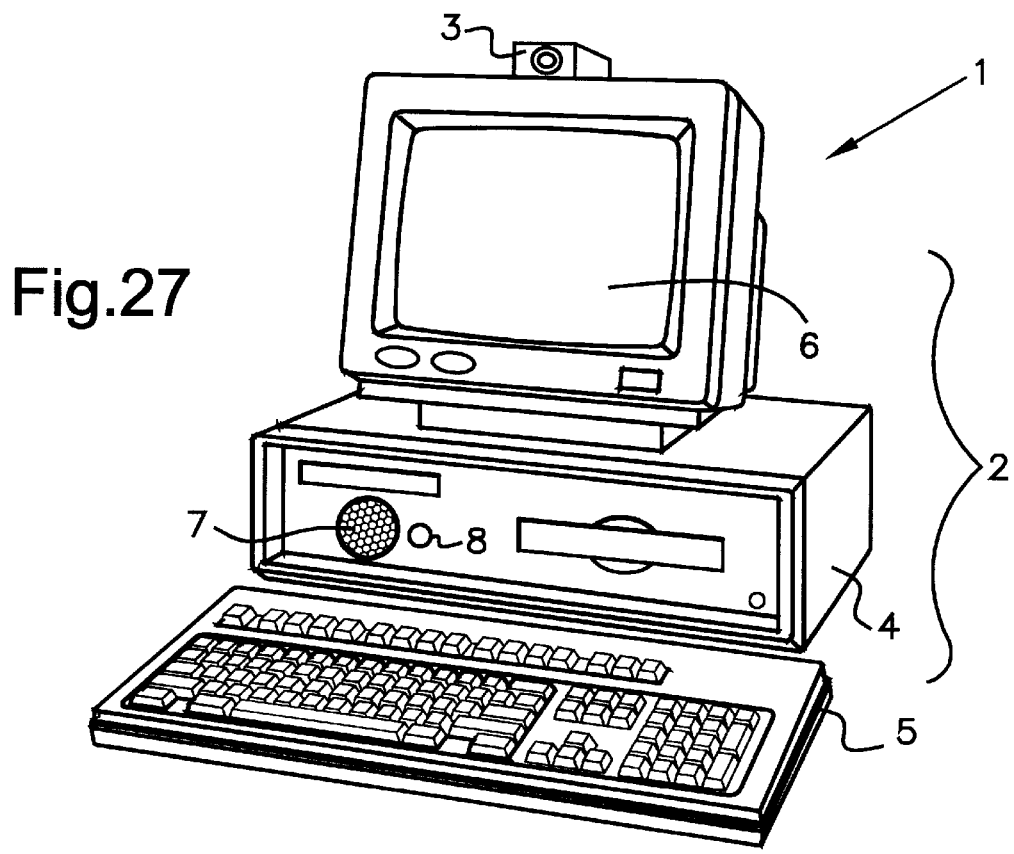
FIG. 27 is a perspective view showing a prior art.

FIG. 26 is a simplified perspective view of a picture telephone 71 according to still other preferred embodiment. In the still other preferred embodiment as well, the displaying/imaging apparatus 11 of the invention is mounted to a main unit 72 and the speaker 69 and the microphone 70 are disposed. The displaying apparatus 11 also serves as inputting means which includes ten numerical keys. By contacting or pressing an inputting point 73 or by manipulation with a finger of a hand of an operator, an inputting operation such as dialing a number is realized.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A television communication apparatus comprising:
   (a) a displaying/imaging apparatus disposed to face an operator comprising:
      a pair of spaced apart substrates which define an internal volume therebetween, at least one of the substrates being light transmissive;
      a matrix of pixel electrodes mounted on a volume-oriented side of at least one of the substrates;
      at least one light-receiving element of an imaging device mounted within the internal volume;
      a discrete light receiving electrode having means for adjusting the amount of light received by the light-receiving element;
      a dielectric interposed within the internal volume, the dielectric providing a display function in accordance with activation of the pixel electrodes;
   (b) image driving means for receiving an image signal through a communication line and providing the pixel electrodes with the image signal to perform a display operation;
   (c) a speaker;
   (d) an audio driving circuit for receiving an audio signal through the communication line and driving the speaker;
   (e) a microphone; and (f) transmitting means for transmitting outputs from the outputting means and the microphone to the communication line.

2. A combined display and imaging apparatus comprising:
a pair of spaced apart substrates which define an internal volume therebetween, at least one of the substrates being light transmissive;
a matrix of display elements mounted on a volume-oriented side of at least one of the substrates;
at least one light-receiving element of an imaging device mounted within the internal volume;
a discrete light receiving electrode having means for adjusting the amount of light received by the light-receiving element;
a dielectric which is interposed within the internal volume, the dielectric providing a display function in accordance with activation of the display elements.

3. The apparatus of claim 2, wherein the pair of substrates transmits light and a light shielding layer is formed in the rear of the light-receiving element.

4. The apparatus of claim 2, wherein both the matrix of display elements and the at least one light-receiving element of the imaging device are mounted on a rear of one of the substrates.

5. The apparatus of claim 2, wherein the dielectric is a liquid crystal, wherein the volume-oriented side of at least one of the substrates has:
a plurality of gate lines formed thereon to extend in a first direction;
a plurality of source lines formed thereon to extend in a second direction, the second direction being perpendicular to the first direction;
an aperture being bounded between two adjacent ones of the gate lines and two adjacent ones of the source lines, and
wherein within the aperture are provided:
a pixel electrode which causes the liquid crystal to attain a display function; and
a discrete light-receiving element.

6. The apparatus of claim 5, wherein within the aperture is also provided a switching element connected to one of the gate lines and to one of the source lines for activating the pixel electrode.

7. The apparatus of claim 6, wherein plural switch elements and plural pixel electrodes are provided for corresponding plural apertures, and wherein the switch elements are
thin film transistors provided so as to correspond to intersections of the gate lines and the source lines,
each of the thin film transistors including a source electrode which is connected to one of the source lines, a gate electrode which is connected to one of the gate lines, and a drain electrode which is connected to one of the pixel electrodes,
the source electrode and the drain electrode of each thin film transistor being brought into conduction on application of a voltage of one level to the gate lines, and being brought out of conduction on application of a voltage of another level to the gate lines;
a common electrode confronting the pixel electrodes is formed on the other of the surfaces facing each other of the pair of substrates; and
means for applying a displaying voltage equal to or larger than a threshold value which activates the dielectric element and for applying a control voltage which brings the thin film transistors into conduction or out of conduction, to the gate lines, is provided between the source lines and the common electrode.

8. The apparatus of claim 7, wherein the thin film transistors and the light-receiving elements are arranged between the source lines which are adjacent to each other in the column direction of the pixel electrodes so as to be adjacent to each other in the row direction of the pixel electrodes.

9. The apparatus of claim 7, wherein
on light-receiving surfaces of the light-receiving elements are formed discrete light-transmitting electrodes for adjusting a light-receiving amount,
the discrete electrodes are connected to the source lines,
a voltage is applied to the source lines during a displaying period and a period of adjusting the light-receiving amount which are set alternately, and
a voltage which keeps the thin film transistors out of conduction is applied to the gate lines during the period of adjusting the light-receiving amount.

10. The apparatus of claim 5, wherein within the aperture is also provided at least a portion of a readout device which is connected to the light-receiving element.

11. The apparatus of claim 10, wherein plural light-receiving elements are provided.

12. The apparatus of claim 11 wherein the readout device is a semiconductor device and comprises:
column shift registers for reading out the outputs from light-receiving elements of each column in a parallel manner and shifting the outputs as a serial bit in a column direction; and
a row shift register for sequentially deriving an output of each column shift register as a serial bit to a common output terminal for each column shift register.

13. The apparatus of claim 12, wherein the column registers and the row shift register are structured so that scanning using a charge coupled device is carried out.

14. The apparatus of claim 5, wherein discrete light-transmitting electrodes for adjusting a light-receiving amount are formed on light-receiving surfaces of the respective light-receiving elements, and the amount of light received via the dielectric element by the light-receiving surfaces is adjusted by changing a light transmittance depending on a voltage between the discrete light-receiving amount adjusting electrodes and the electrodes formed on the substrate confronting the substrate on which the light-receiving elements are formed.

15. The apparatus of claim 14, wherein lines for adjusting the light-receiving amount and the light-receiving elements are formed on one of the pair of substrates to be along and adjacent to the source lines, and
the discrete light-receiving amount adjusting electrodes are connected to the light-receiving amount adjusting lines.

16. The apparatus of claim 14, wherein
a distance of the discrete light-receiving amount adjusting electrodes from a common electrode is selected to be smaller than a distance of the pixel electrodes from the common electrode, and the discrete light-receiving amount adjusting electrodes are connected to the source lines; and
a voltage is applied to the source lines during a displaying period and a period of adjusting the light-receiving amount which are set alternately, and the voltage applied during the period of adjusting the light-receiving amount is selected to be a value lower than the displaying voltage applied during the displaying period, which value does not activate the dielectric element existing between the pixel electrodes and the common electrode.

17. A combined display and imaging apparatus comprising:
- a pair of spaced apart substrates which define an internal volume therebetween, at least one of the substrates being light transmissive;
- a matrix of display elements mounted on at least one of the substrates;
- at least one light-receiving element of an imaging device;
- a discrete light-receiving electrode having means for adjusting the amount of light received by the light-receiving element;
- a liquid crystal interposed within the internal volume;
- wherein the at least one of the substrates has formed thereon:
    - a plurality of gate lines formed thereon to extend in a first direction;
    - a plurality of source lines formed thereon to extend in a second direction, the second direction being perpendicular to the first direction;
    - an aperture being bounded between two adjacent ones of the gate lines and two adjacent ones of the source lines, and
    - wherein within the aperture is provided:
        - a discrete one of the display elements of the matrix; and
        - a discrete light-receiving element.

18. The apparatus of claim 17, wherein within the aperture is also provided a switching element connected to one of the gate lines and to one of the source lines for activating the discrete one of the display elements of the matrix.

19. The apparatus of claim 17, wherein within the aperture is also provided at least a portion of a readout device which is connected to the light-receiving element.

* * * * *